US 6,360,177 B1

(12) United States Patent
Curt et al.

(10) Patent No.: US 6,360,177 B1
(45) Date of Patent: Mar. 19, 2002

(54) VOLTAGE SCANNING, MEASUREMENT, STORAGE AND REPORTING DEVICE

(75) Inventors: Walter M. Curt; Glen K. Shomo, III, both of Harrisonburg, VA (US)

(73) Assignee: Shenandoah Electronic Intelligence, Inc., Harrisonburg, VA (US)

( * ) Notice: Subject to any disclaimer, the term of this patent is extended or adjusted under 35 U.S.C. 154(b) by 0 days.

(21) Appl. No.: 09/002,392

(22) Filed: Jan. 2, 1998

Related U.S. Application Data

(63) Continuation-in-part of application No. 08/885,851, filed on Jun. 30, 1997, now abandoned, which is a continuation-in-part of application No. 08/678,605, filed on Jul. 15, 1996, now abandoned, which is a continuation-in-part of application No. 08/486,051, filed on Jun. 7, 1995, now abandoned, which is a continuation-in-part of application No. 07/973,392, filed on Nov. 10, 1992, now abandoned.

(51) Int. Cl.$^7$ ............................................. G01R 19/165
(52) U.S. Cl. ..................... 702/64; 702/57; 702/198; 340/660; 340/661; 324/113
(58) Field of Search ................ 702/57, 60–62, 702/65–68, 79, 80, 120, 122, 117, 124–126, 180, 183, 184, 187, 188, 189, 193, 198, FOR 111, FOR 170, FOR 171, FOR 103, FOR 105, FOR 106, FOR 110; 705/412; 324/990, 100, 103 R, 141, 142, 76.15, 73.1, 76.42, 113, 116, 157; 340/870.02, 16, 21, 657, 660–663; 346/150.1; 363/143; 700/73, 74, 286, 291–298; 341/155, 122, 126; 361/78, 79, 86, 88, 89, 90, 91.1; 323/237

(56) References Cited

U.S. PATENT DOCUMENTS

| | | | |
|---|---|---|---|
| 3,657,528 A | * 4/1972 | Plante | 702/198 |
| 4,120,031 A | 10/1978 | Kincheloe et al. | 705/412 |
| 4,207,611 A | 6/1980 | Gordon | 701/33 |
| 4,236,217 A | 11/1980 | Kennedy | 702/61 |
| 4,291,376 A | 9/1981 | McCahill | 702/61 |
| 4,345,311 A | * 8/1982 | Fielden | 324/142 |
| 4,465,970 A | 8/1984 | DiMassimo et al. | 324/116 |
| 4,567,425 A | * 1/1986 | Bloomer | 323/237 |
| 4,658,323 A | * 4/1987 | Dougherty | 361/79 |
| 4,803,632 A | 2/1989 | Frew et al. | 705/412 |
| 4,811,136 A | * 3/1989 | Jones et al. | 361/79 |
| 4,814,996 A | 3/1989 | Wang | 705/412 |
| 4,864,226 A | 9/1989 | Tachimoto et al. | 324/157 |
| 4,949,274 A | 8/1990 | Hollander et al. | 324/142 |
| 5,144,226 A | * 9/1992 | Rapp | 702/198 |
| 5,153,837 A | * 10/1992 | Shaffer et al. | 705/412 |
| 5,229,651 A | * 7/1993 | Baxter, Jr. et al. | 340/661 |
| 5,248,967 A | * 9/1993 | Daneshfan | 702/60 |
| 5,450,268 A | * 9/1995 | Phillips et al. | 361/79 |
| 5,553,094 A | * 9/1996 | Johnson et al. | 324/110 |

* cited by examiner

Primary Examiner—Hal Wachsman
(74) Attorney, Agent, or Firm—Smith, Gambrell & Russell, LLP

(57) ABSTRACT

A portable unit, preferably adapted for plugging into a common wall outlet, has circuitry for monitoring the voltage and/or current provided through an electrical outlet. In addition to the monitoring circuitry, the unit preferably includes a microprocessor for digitally processing the power waveform as well as analytical quantities related to the waveform. Further, the unit preferably has a storage area for storing samples of the input waveform as well as a log of related analytical quantities for downloading to a computer, local area network, or other destination, for collection and analysis. Preferably, the unit is provided with a local visual display and an alarm indicator.

22 Claims, 13 Drawing Sheets

Microfiche Appendix Included
(2 Microfiche, 99 Pages)

VOLTAGE SCANNING, MEASUREMENT, STORAGE AND REPORTING DEVICE

This application is a continuation-in-part of U.S. patent application Ser. No. 08/885,851, filed Jun. 30, 1997, now abandoned which in turn is a continuation-in-part application of U.S. patent application Ser. No. 08/678,605, filed Jul. 15, 1996, now abandoned, which in turn was a continuation-in-part application of U.S. patent application Ser. No. 08/486,051, filed Jun. 7, 1995, now abandoned, which in turn was a continuation-in-part of U.S. patent application Ser. No. 07/973,392, filed Nov. 10, 1992, now abandoned, which applications are incorporated entirely herein by reference.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

MICROFICHE APPENDIX

A computer program listing for the present invention is set forth in a Microfiche Appendix which is on file in the present patent application. This Microfiche Appendix includes two (2) sheets, with the first sheet having sixty (60) frames and the second sheet having thirty-nine (39) frames.

BACKGROUND OF THE INVENTION

1. Field of the Invention

The present invention relates to voltage monitoring devices. More specifically, the invention relates to small, portable, AC voltage measuring devices which can readily be used to monitor and record abnormal voltage conditions in supply electricity. The invention also relates to the use of several of these monitoring devices over a wide geographical area, through a communications network such as a local area network (LAN) or wide area network (WAN).

2. Related Art

Various devices for measuring voltage abnormalities are known in the art. Such devices are designed to determine when dangerous or otherwise undesirable voltage conditions exist on AC power lines.

For example, voltage spikes, as well as more enduring overvoltage and undervoltage conditions, are known to cause damage or improper functioning of equipment, especially computers. By monitoring the occurrence of voltage abnormalities, preventive or corrective action may be taken to prevent further occurrences. Moreover, when a voltage abnormality is disproved at a time of equipment malfunction, troubleshooting may focus on the equipment itself and not on the power supply to the equipment.

Unfortunately, most known systems have been crude in operation or limited in their applications. Some monitoring systems merely signal an abnormality locally, so that an individual user would have to be physically present during an alarm condition, or inspect the alarm unit soon after an alarm condition. Also, known systems have been deficient in their ability to comprehensively specify the time, duration, and nature of any electrical supply abnormalities. Further, many known systems have been physically large, making them unsuitable for distribution to or movement among various sites. These limitations have made it difficult to localize the cause of equipment damage or malfunction, confirm the time it occurred, or determine the reason that it occurred.

Moreover, in many institutions such as universities, in which a substantially large number of electrically sensitive instruments such as computer terminals are broadly distributed, a comprehensive monitoring system is needed to efficiently determine the cause of otherwise perplexing problems.

Therefore, there is a need in the art to provide a simple, portable, but functionally sophisticated and comprehensive, electrical power measuring, storing and reporting device. Moreover, there is a need in the art to provide such a monitoring device which can be remotely controlled and accessed through a communications network. It is to meet this need that the present invention is directed.

SUMMARY OF THE INVENTION

The present invention provides a portable monitoring unit, preferably adapted for plugging into a common wall outlet, having circuitry for monitoring the voltage provided through the outlet. In addition to the monitoring circuitry, the invention preferably includes a microprocessor for analyzing the monitored waveform. The microprocessor recognizes specific voltage occurrences, based upon parameters which can be varied by the user.

The invention also has a storage memory for storing samples of the input waveform. The invention employs this memory to keep a log of particular waveform information, over predetermined periods of time. In this fashion, the memory stores waveform information in an arrangement that can be easily downloaded to a computer, local area network, or other destination, for conversion into useful histograms, charts, and the like.

In addition, the invention also has a communication interface, so that it can provide the information it collects to a remote location through a communications network, such as a LAN or a WAN. Further, the operation of the invention can be controlled from a remote location through such a communications network by way of the communication interface.

Preferably, the invention also is provided with a local visual display and an alarm indicator.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

Figure 1:
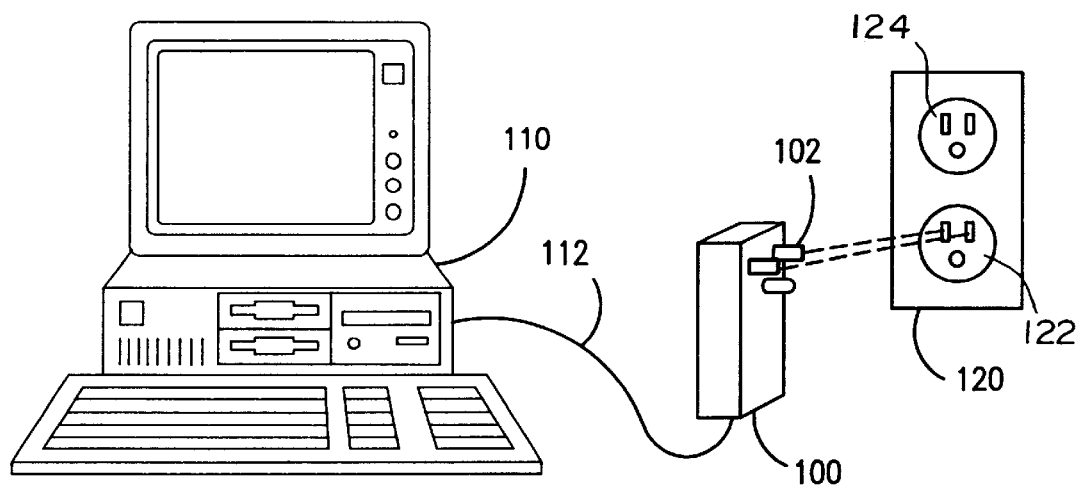
FIG. 1 is a perspective drawing, not to scale, schematically illustrating a single monitoring unit according to the preferred embodiment of the present invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

FIG. 1 illustrates in perspective view, not to scale, a monitoring unit 100 according to a preferred embodiment of the present invention. Monitoring unit 100 is connected to a personal computer 110 via a suitable communication cable 112, the interface operating under the RS-232 protocol. Monitoring unit 100 is equipped with a pair of prongs 102 which are adapted to fit into a conventional 120 volt AC electrical outlet 120. In the illustrated embodiment, the prongs 102 are located on a back face of the unit 100 near its upper end, so that when the unit 100 is plugged into the outlet 120 at its lower position 122, the upper position 124 is maintained free for use by other appliances or equipment.

The monitoring unit 100 constitutes a part of the present invention, and may be used in configurations other than that illustrated in FIG. 1. Examples of uses and configurations, as well as the internal structural details of the unit, are described below.

The personal computer 110 is illustrated by way of example, and not limitation, as will be appreciated by reviewing the remainder of this specification. A personal computer is but one possible destination of information provided by the monitoring unit. However, if a personal computer is used as the direct recipient of information from the unit, any computer having a suitable communications protocol capability may be used. In a particularly preferred embodiment, the communications protocol is the RS-232 protocol, using common TELCO (telephone company) jacks for effective use as an interface. Other protocols and communications interfaces may readily be employed.

Figure 2:
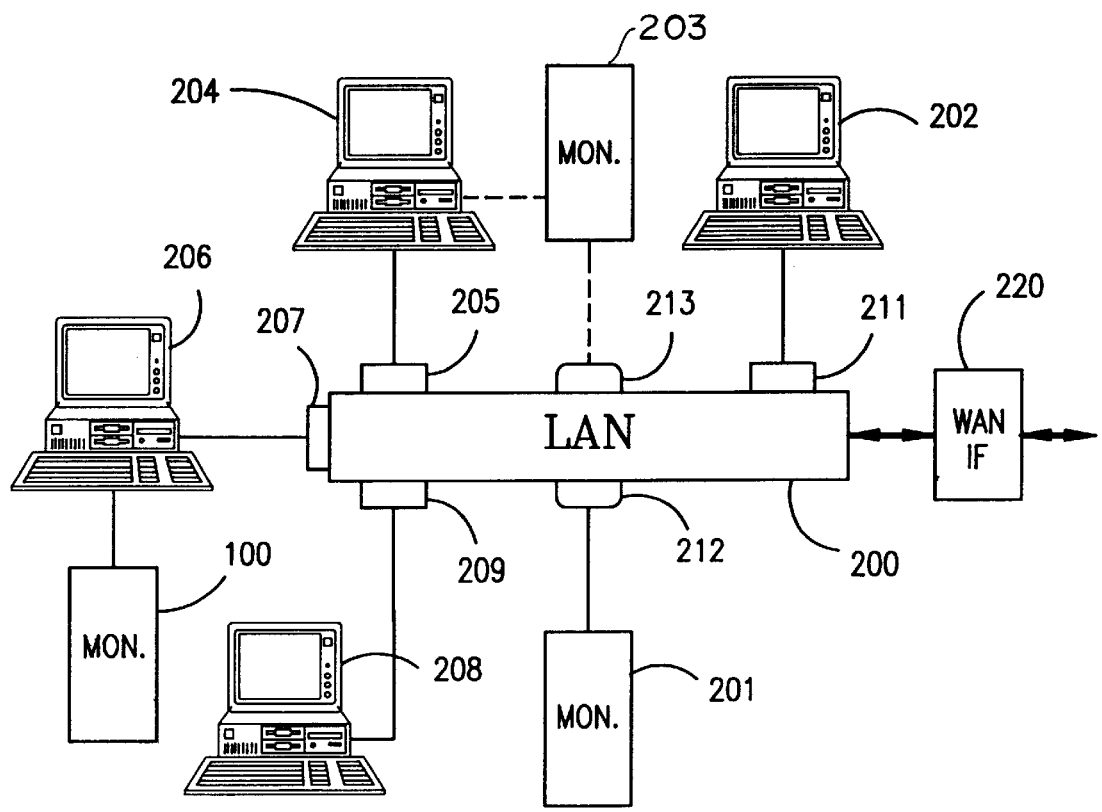
FIG. 2 is a block diagram schematically illustrating various possible configurations involving the monitoring unit, in association with various personal computers in a local area network (LAN) configuration.

Referring now to FIG. 2, various monitoring units are illustrated in association with a local area network (LAN) 200. As background, it is understood that FIG. 2 illustrates various pieces of equipment such as personal computers (PC's) 202, 204, 206, and 208. Each of the personal computers is provided with an interface to the LAN 200, including respective interfaces 205, 207, 209, and 211, and therefore serve as workstations for the LAN 200.

A first monitoring device 100 is shown connected to PC 206, in the same manner illustrated in perspective in FIG. 1. However, it is contemplated that a monitor such as monitoring device 201 may be deployed, directly connected to a local area network by a special interface 212. Moreover, still another monitoring unit 203 is shown physically separate from all other elements in the system, with the understanding that, at a later time, the information stored in monitoring unit 203 may be downloaded to a suitable destination, such as one of the personal computers (204) or the LAN 200 itself (via interface 213). If connected through a local PC, the software interface to the monitoring unit preferably includes a TSR (terminate and stay resident) program operating in the background.

More specifically, the server application for the communications network allows the user to initiate message requests to the monitoring units over the communications network through the workstations (e.g., 202, 204, 206, or 208) for the network, using the network layer protocol. Typically, the server application of the LAN 200 advertises its presence by broadcasting a message to all of the workstations for the LAN 200. Any active workstation associated with a monitoring unit responds to the message, thereby allowing a user to identify and track the locations of the monitoring units.

In the illustrated configuration, the various monitoring devices 100, 201, 203, and so forth, must monitor the electrical power provided at their respective locations. In a typical, practical arrangement, not every personal computer involved in a LAN would be connected to a monitoring device. Rather, a few personal computers would be provided with respective monitoring devices, so as to effectively "cover" the electrical and geographic area encompassed by the LAN. In a particularly preferred embodiment, the LAN is shown connected to a wide area network (WAN) via a WAN interface 220.

In the embodiment illustrated in FIG. 2, the various monitoring devices 100, 201, 203, and so forth, provide information via their respective cables and interfaces to a system operator PC which may be any of the PC's shown in FIG. 2. In this manner, a system operator PC may display a set of data relating to the electrical power provided at the various monitored locations.

Further, if an even broader geographic coverage is desired, the information from the various monitored locations may be sent to an arbitrarily distant location, through, for example, the WAN interface 220.

Figure 3:
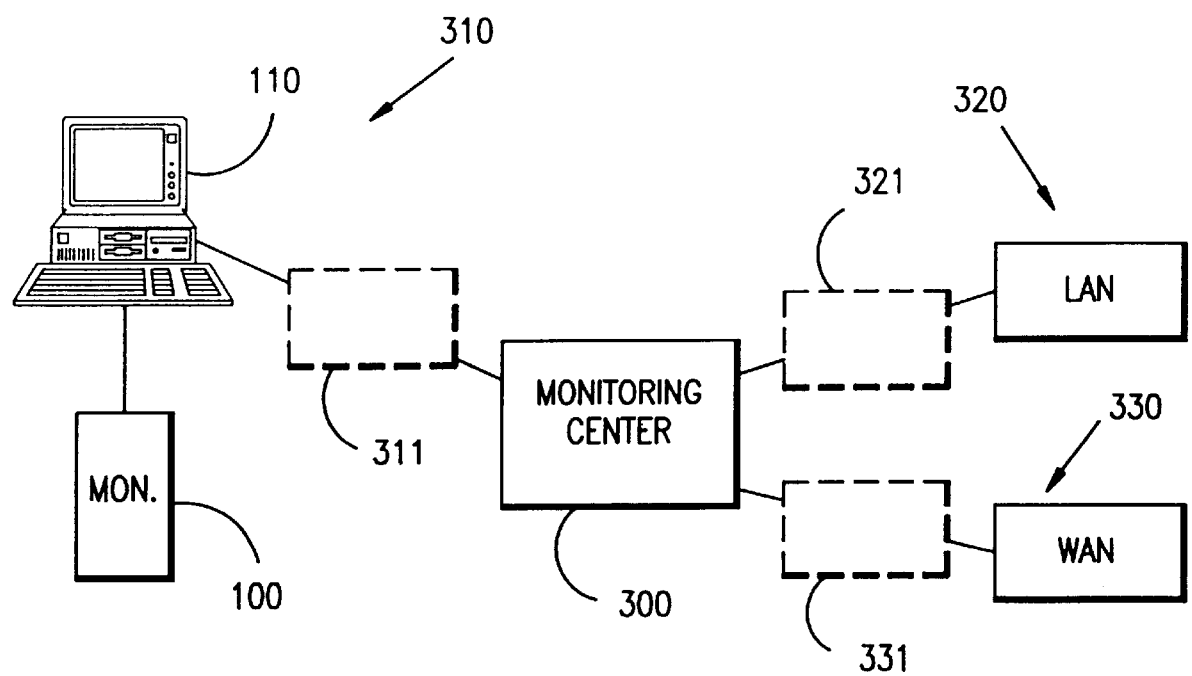
FIG. 3 is a block diagram schematically illustrating a monitoring center which monitors various remote locations, each remote location having one or more monitoring units according to the present invention.

The breadth and scope of the monitoring capabilities of the present invention are illustrated schematically in FIG. 3. Referring to FIG. 3, a monitoring center 300 is shown connected to various remote locations 310, 320, and 330, which locations are shown by way of example and not limitation.

Location 310 includes a single personal computer 110 with an associated monitor 100, connected in the same manner illustrated in FIG. 1. Further, location 310 includes a suitable communications device, such as a modem, which allows computer 110 to communicate with the monitoring center.

Location 320 is more typical of that arrangement shown in FIG. 2. Location 320 essentially comprises a local area network, presumably including a substantial number of computers and a plurality of monitoring devices.

Location 330 is shown generally as a wide area network, and may include various subcomponents that are more typical of those in locations 310 and 320.

Each of locations 310, 320, 330 is connected to the monitoring center 300 via a suitable communications medium. Illustrated in phantom are communications networks 311, 321, 331, which may be, for example, ordinary telephone company networks. However, the invention, and the applications of the monitoring device according to the invention, need not be so limited.

Figure 4:
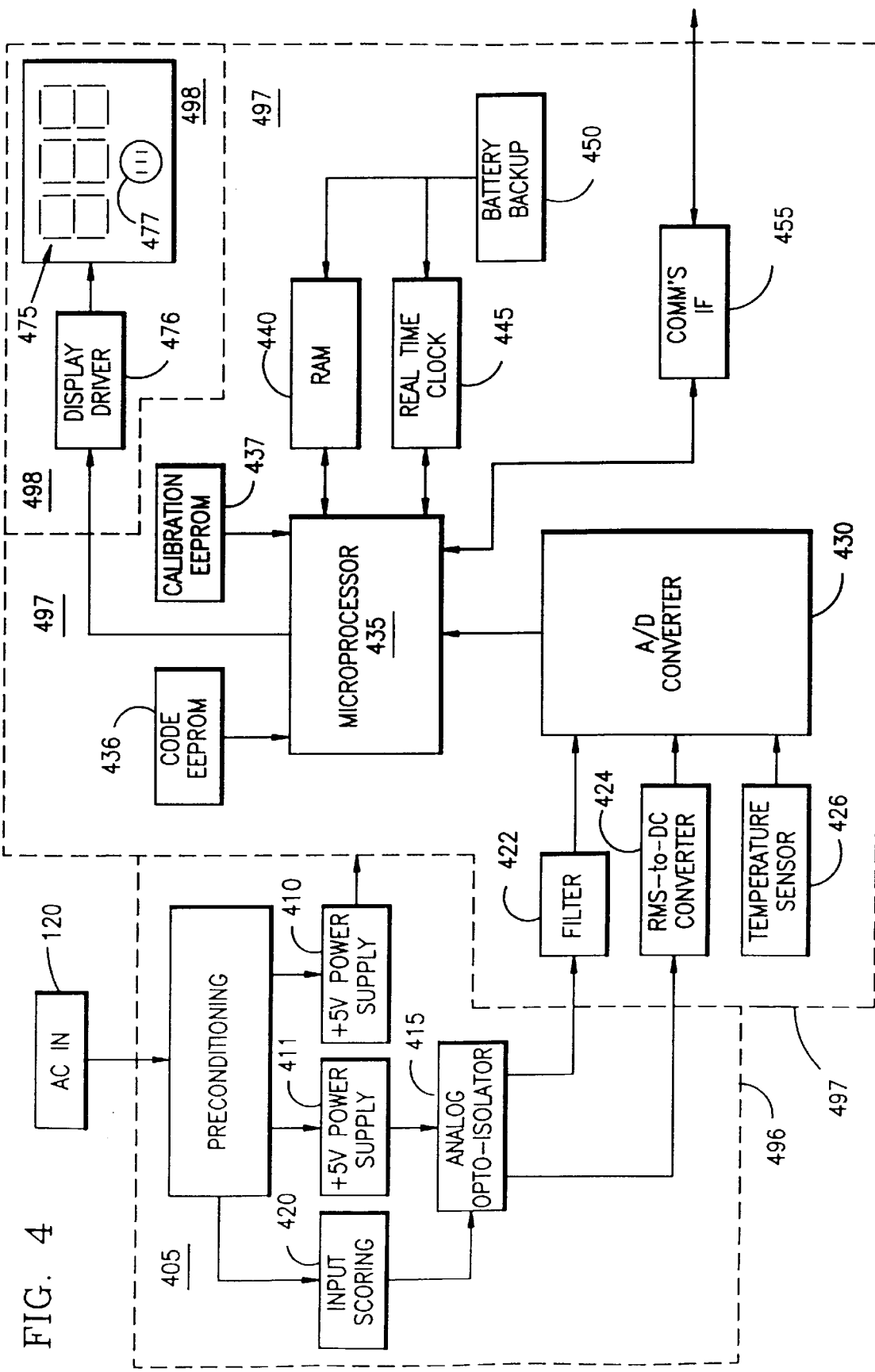
FIG. 4 is a high-level block diagram illustrating components of a preferred monitoring unit according to the present invention.

FIG. 4 is a high-level block diagram illustrating components of a preferred monitoring unit according to the present invention. Referring to FIG. 4, the AC input waveform is provided by socket 120 to a preconditioning element 405. The power portion 496 of the unit includes preconditioning element 405, which performs such preliminary functions as filtering the input waveform. The preconditioning element 405 may also include fuses, surge protectors, and the like. The AC waveform which is output by the preconditioning element 405 is input to first and second power supplies 410, 411.

Power supply 410 provides power to the substantial remainder of the monitoring unit, including the controller portion 497 and display portion 498, to be described in greater detail below. Power supply 411 provides power to an analog opto-isolator 415. In one preferred embodiment, both power supplies 410, 411 are +5 volt power supplies.

An input scaling element 420 reduces the filtered AC input waveform to a level which is acceptable to analog opto-isolator 415. Advantageously, opto-isolator 415 replaces conventional (and bulky) transformers, and serves to isolate the delicate circuitry in the controller portion 497 and the display portion 498. The analog opto-isolator 415 provides an isolated waveform to a filter 422 and an RMS-to-DC converter 424.

In a preferred embodiment of the monitoring unit, the RMS-to-DC converter 424 continuously produces a DC voltage value proportional to the true RMS (root mean square) value of the input AC waveform. In a preferred embodiment of the monitoring unit, the RMS-to-DC converter 424 is configured to have a one cycle response time for a 60 Hertz signal.

The outputs of the converter 424 and the filter 422 are received by an analog-to-digital converter (ADC) 430, along with the output of a temperature sensor 426. The ADC 430 converts the filter output, DC level, and temperature from elements 422, 424, and 426, respectively, into binary words which are input to a microprocessor 435. Ideally, the microprocessor 435, through the ADC 430, samples the output of the converter 424 several times per cycle for a 60 Hz input signal. The manner in which ADC 430 and microprocessor 435 interface are readily appreciated by those skilled in the art, and thus are not detailed here.

It will be understood that the binary words produced by ADC 430 represent specific RMS voltages values of the input AC waveform, and that desired mathematical operations can be performed on these binary words as substitutes for the specific RMS voltage values they represent. Accordingly, those of ordinary skill in the art will appreciate that many portions of the following specification which discuss operations performed on voltage values are applicable to either the actual RMS voltage values or the binary words representing those values. Thus, the specification is not intended to be limited to its literal language since a binary word can be substituted for an actual RMS voltage in a disclosed operation.

Those of ordinary skill in the art also will appreciate that the arrangement discussed above ensures that any changes in the input waveform which last one cycle or longer are accurately monitored by the RMS-to-DC converter 424 and ADC 430, and are passed along to the microprocessor 435. However, it should also be apparent that this arrangement also indirectly monitors changes in the input waveform that are less than one cycle in duration, since these changes are inherently included in the output provided by the RMS-to-DC converter 424. The microprocessor 435 is thus able to recognize and record waveform information which may be considered important to a user.

Various other elements are provided in conjunction with microprocessor 435. For example, a first "code" EPROM 436 (erasable programmable read only memory) provides executable instruction code to the microprocessor, so that it may carry out its functions. Also, a "calibration" EEPROM 437 is provided, and serves the function of allowing microprocessor 435 to operate with parameters that vary with the particular monitoring unit's location and environment. Advantageously, EPROM 436 and EEPROM 437 may be erased and re-programmed, thus providing flexibility to the functional features of the inventive monitoring unit.

A random-access-memory (RAM 440) is provided. RAM 440 is used by microprocessor 435 as a scratchpad for the microprocessor's analytical calculations. Also, the RAM 440 is employed as a storage area for waveform information, as will be explained in more detail later. A real time clock 445 is also provided, so that the information received through ADC 430 may be time-tagged, allowing formation of a time log of occurrences of events of the AC input waveform.

A preferred embodiment of the invention includes a 3V lithium battery backup 450. The battery backup is used to power the RAM and the real time clock when the unit is not being powered by AC line power, or when the AC line power falls below 80 VAC. This feature is advantageous in allowing an individual to carry the unit from the outlet to a personal computer for downloading of information from RAM 440. Ideally, the backup battery has a minimum capacity of 255 mAHr, and can be used in excess of five years before needing to be replaced.

Alternatively, a capacitor backup may be employed, to allow the information in the RAM 440, as well as the incrementing time values stored in the real time clock 445, to be preserved, even when the monitoring unit is unplugged from the AC power source 120.

A suitable communications interface 455 is also provided. Communications interface 455 is preferably an RS-232 standard interface, allowing communication between the monitoring unit and the destination, as governed by microprocessor 435.

The display portion 498 includes a character display 475, whose output is the digital character controlled by a microprocessor 435 via a suitable display driver 476. According to a preferred embodiment, the character display 475 may be an LCD (liquid crystal display) or an LED (light emitting diode) display. The display portion 498 also preferably includes another indicator as well, such as two-colored LED 477. The microprocessor 435 causes the display portion 498 to display information relating to a voltage RMS (root means square) value of the AC input waveform from outlet 120, as will subsequently be explained.

Figure 5:
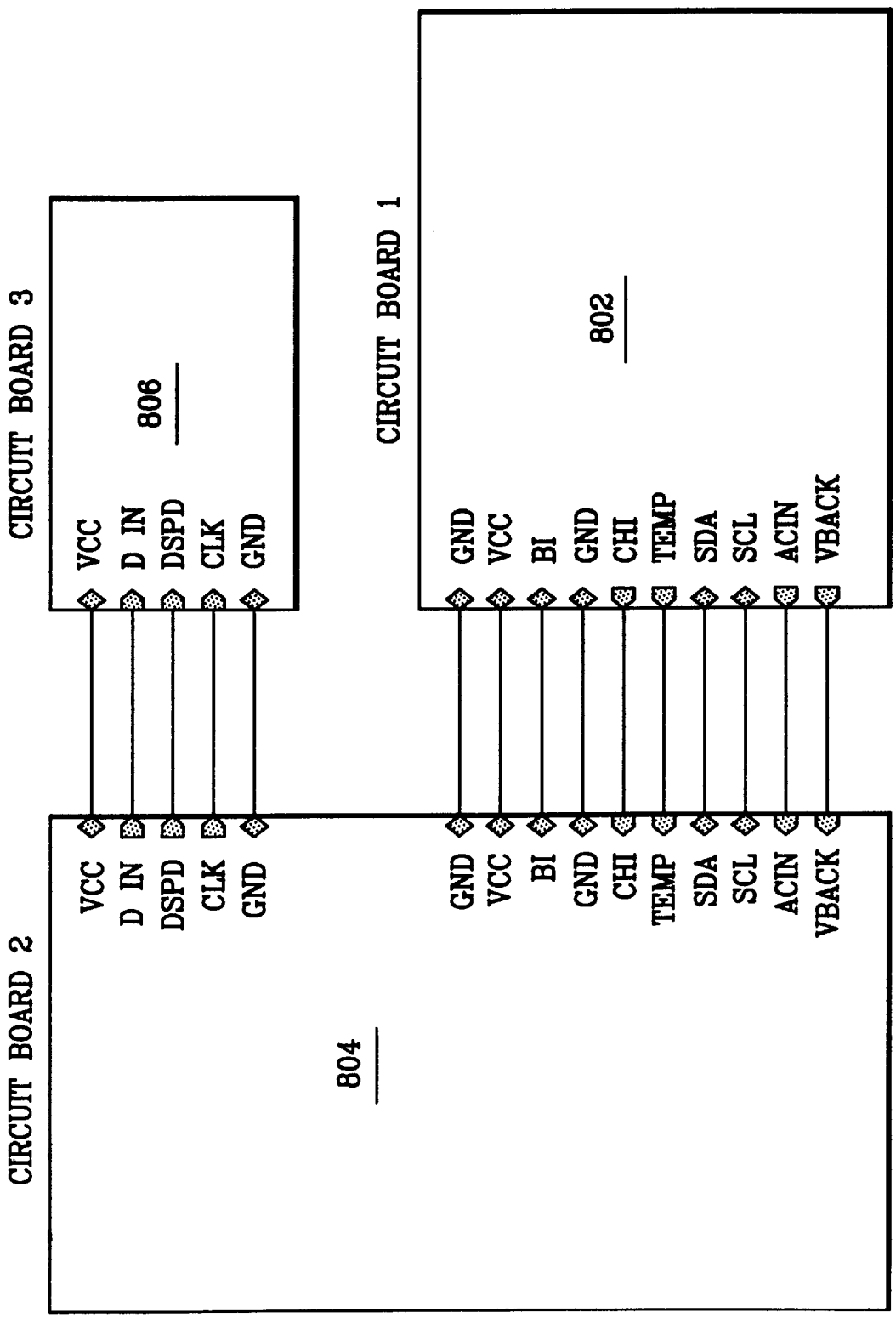
FIG. 5 is a block diagram illustrating the arrangement of three printed circuits boards which comprise a preferred embodiment of the monitoring unit according to the present invention.
Figure 6A:
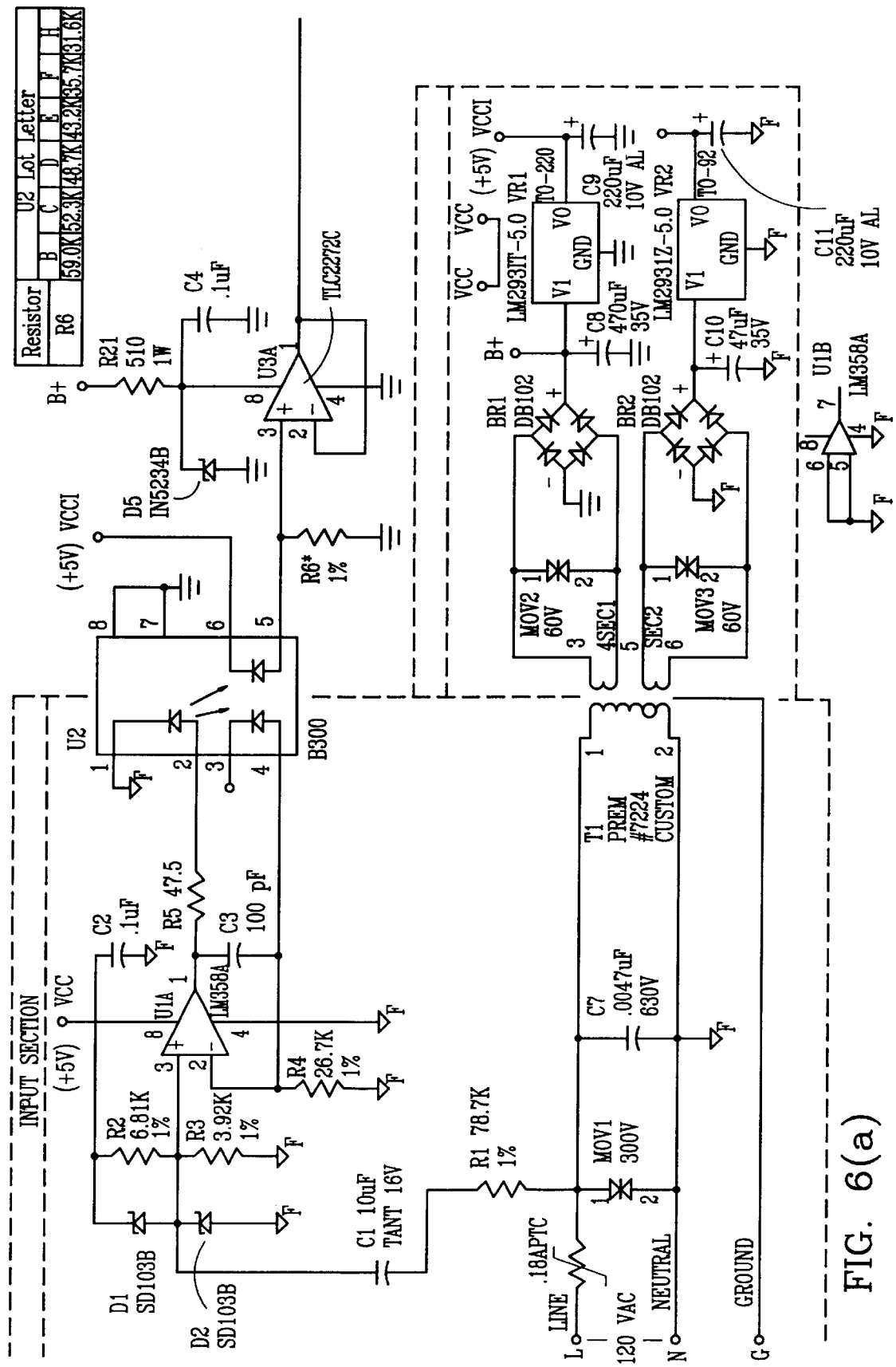
FIG. 6 is a schematic diagram illustrating a particular embodiment of the first circuit board shown in FIG. 4.
Figure 6B:
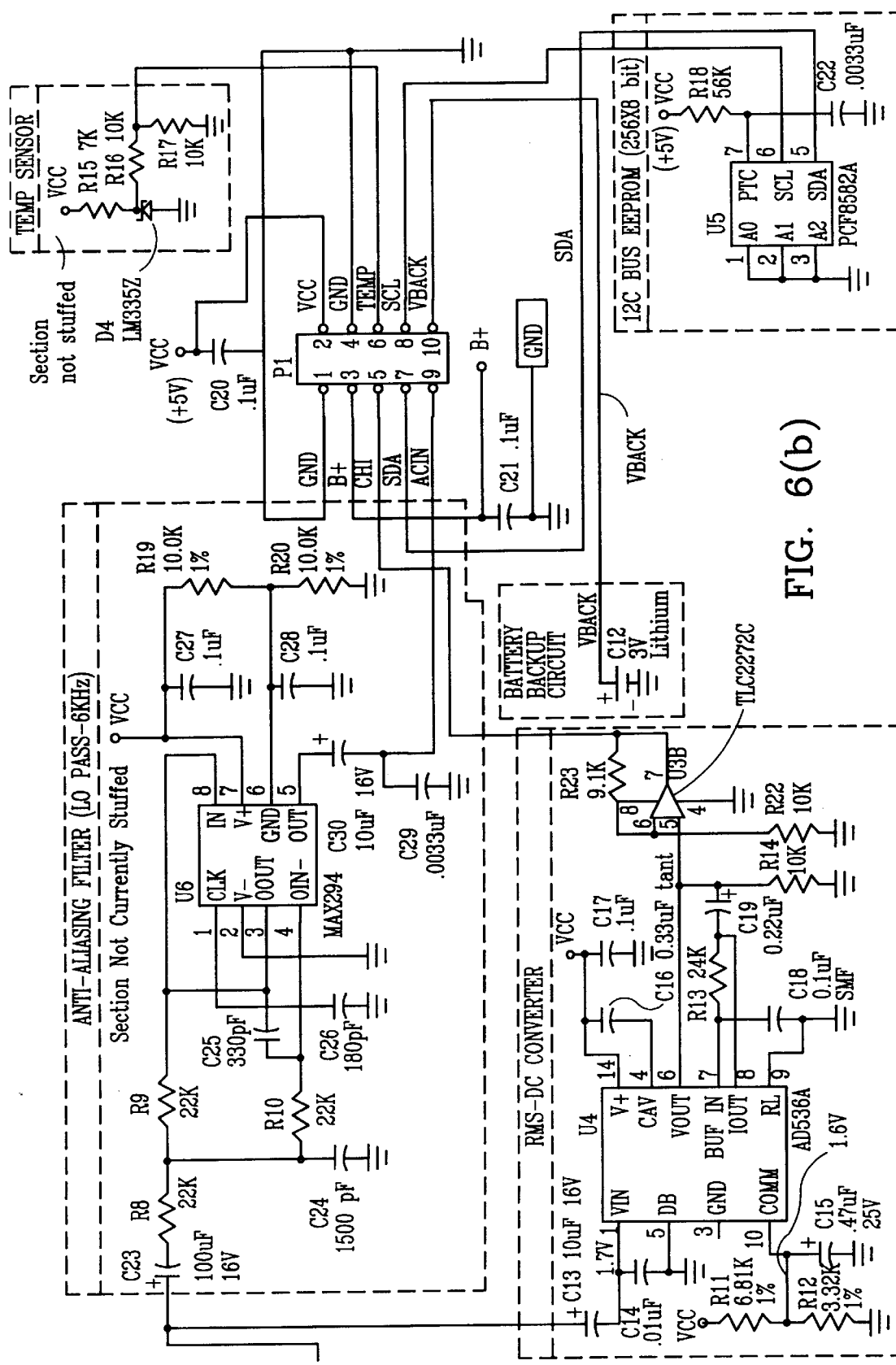
Figure 7A:
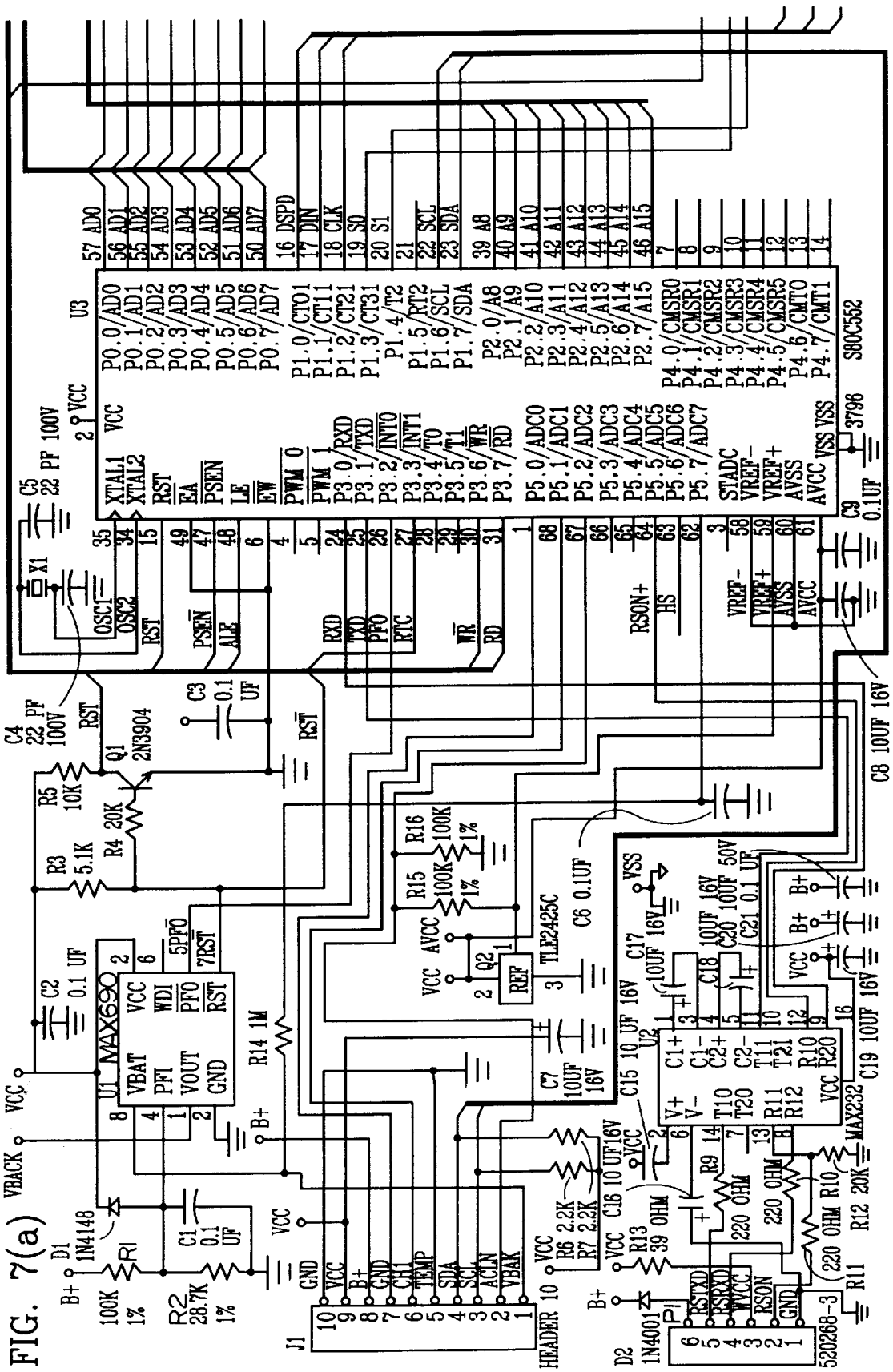
FIG. 7 is a schematic diagram illustrating a particular preferred embodiment of the second circuit board shown in FIG. 4.
Figure 7B:
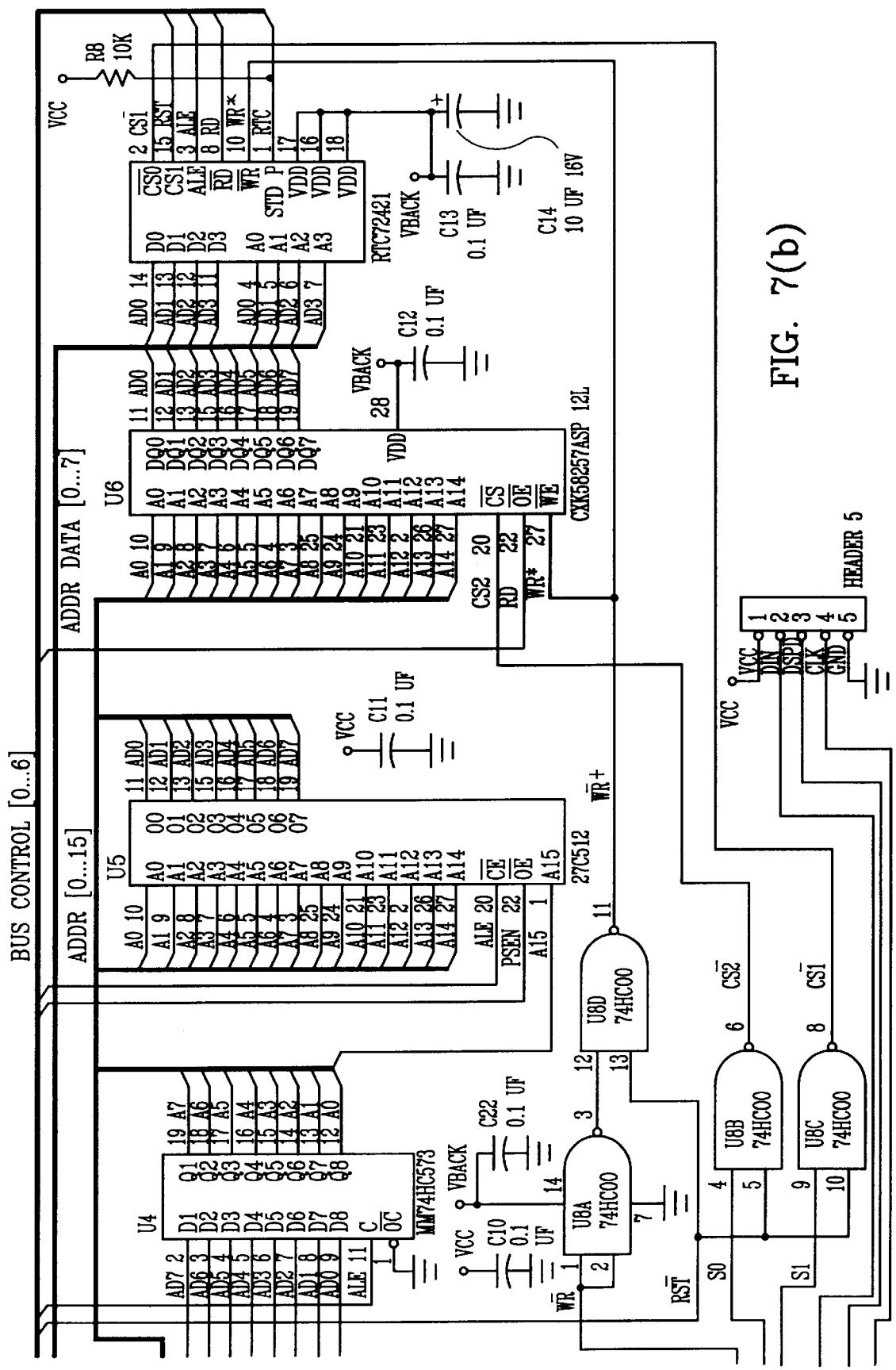
Figure 8:
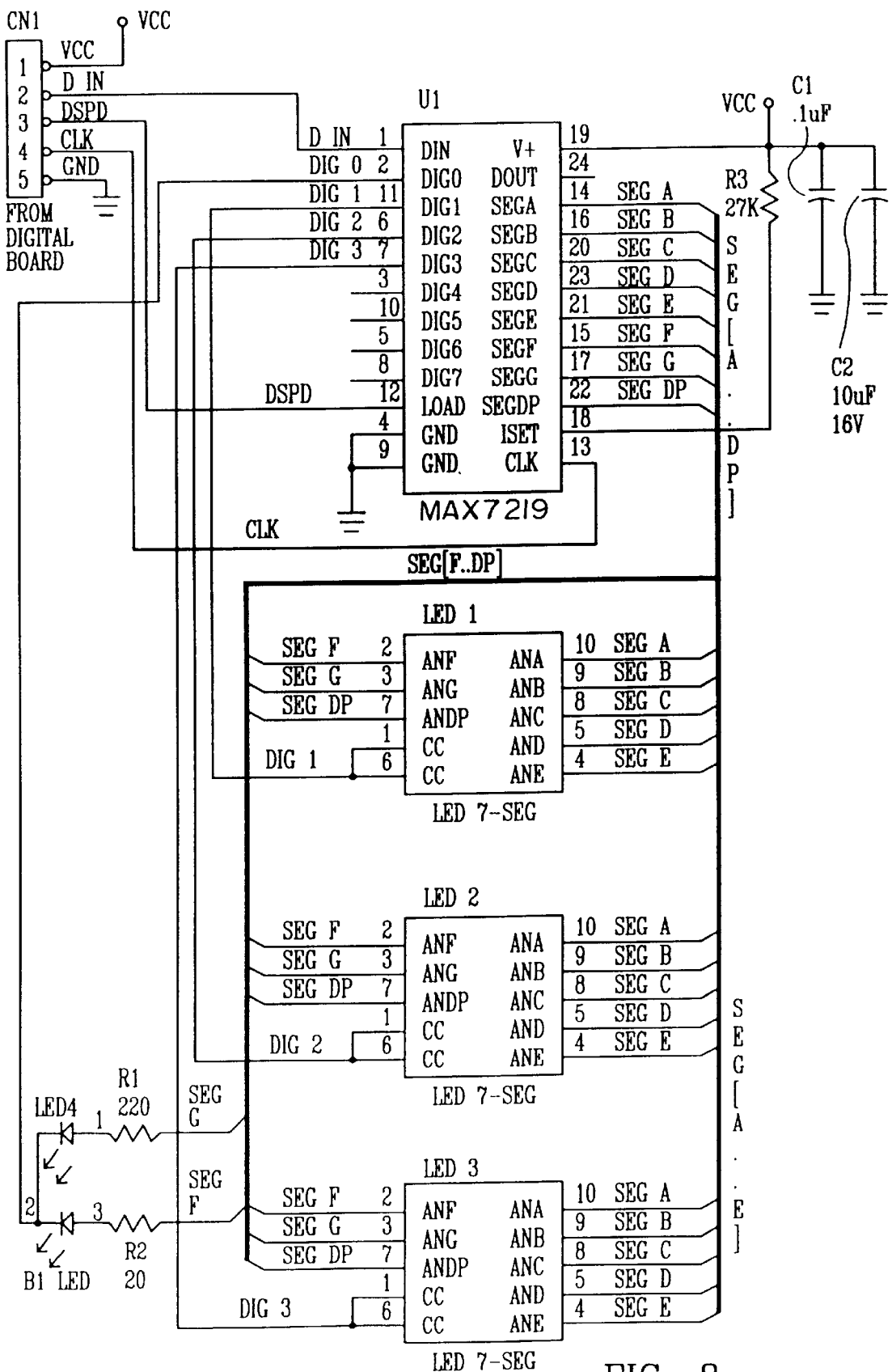
FIG. 8 is a schematic diagram illustrating a particular preferred embodiment of the third circuit board shown in FIG. 4.

According to a particular preferred embodiment, the circuitry in FIG. 4 is arranged on three circuit boards, including a first circuit board 802, a second circuit board 804, and a third circuit board 806. The connection of these boards is shown in FIG. 5, while the detailed layout of these boards is illustrated in FIGS. 6, 7, and 8. The particular circuitry shown and illustrated in FIGS. 6, 7, and 8 may be implemented using the circuit elements listed below in Table A, Table B, and Table C.

TABLE A

Parts List - Circuit Board 1

| DESIGNATOR | DESCRIPTION | MFR | MFR # | Qty |
| --- | --- | --- | --- | --- |
| BR1,BR2 | 1A/100V bridge | Diodes Inc. | DB102 | 2 |
|  | ALTERNATE: | Diodes Inc. | DF01 |  |
| C1,C13 | 10UF 16V tant | Nemco | TB/10/16V/10% | 2 |
|  | ALTERNATE. | Matsuo | 202L1602106K4 |  |
|  | ALTERNATE: | Sprague | 199D106X9016CA1 |  |
|  | ALTERNATE: | Phillips | 41GS106C0116K0AV |  |
|  | ALTERNATE: | AVX | TAP106K016SP |  |
| C2,C4,C17,C20,C21 | .1uF 50V, MLC | Phillips | CY20C104MTP | 6 |
| C27 | ALTERNATE: | Phillips | CW20C104M |  |
| C3 | 100pF, 100V, MLC | Phillips | CN15A101K | 1 |
|  | ALTERNATE: | Phillips | CN15C101K |  |
| C7 | .0047uF, 630V | Panasonic | ECKDNS472MEX | 1 |
| C8 | 470uF, 35V AE | NIC | NRSA471M35V | 1 |
|  | ALTERNATE: | Nichicon | UVX1V471MPA |  |
|  | ALTERNATE: | Panasonic | ECE-A1VU471 |  |
| C9,C11 | 220uF, 10V AE | Panasonic | ECE-A1AU221 | 2 |
|  | ALTERNATE: | Nichicon | UVX1A221MPA |  |
|  | ALTERNATE: | Nichicon | UVR1A221MPA |  |
| C10 | 47uF, 35V | NIC | NRSA47M35V | 1 |
|  | ALTERNATE: | Panasonic | ECE-A1VU470 |  |
|  | ALTERNATE: | Nichicon | UVX1V470MPA |  |
|  | ALTERNATE: | Nichicon | UPF1V470MAH6 |  |
| C12 | 3V Lithium Battery | Panasonic | CR2354-1VC | 1 |
| C14 | .01uF 50V, MLC | Phillips | CW15C103K | 1 |
|  | ALTERNATE: | Mallory | M10R103M5 |  |
|  | ALTERNATE: | Mallory | M15R103M5 |  |
| C15 | .47uF 25V tant | Nemco | TB/0.47/35V/10% | 1 |
|  | ALTERNATE: | Matsuo | 202L3502474K |  |
|  | ALTERNATE: | Panasonic | ECS-F1VE474 |  |
|  | ALTERNATE: | Phillips | 41GS474A035K0A |  |
|  | ALTERNATE: | AVX | TAP474K035SP |  |
| C16 | .33uF 35V tant | Panasonic | ECS-F1VE334 | 1 |
| C18 | .1UF 50V 5% stk mtl flm | Panasonic | ECQ-V1H104JL | 1 |
| C19 | .22uF 35V tant | Panasonic | ECS-F1VE224 | 1 |
| C22 (U5=X24C04P) | ZERO OHM JUMPER |  |  | 1 |
| C22 (U5=PCF8582A) | .0033uF 25V disk | Panasonic | ECF-F1E332KB | 1 |
|  | ALTERNATE: | Mallory | M10R332K5 |  |
|  | ALTERNATE: | Mallory | M20R332K2 |  |
| D1,D2 | Diode, Schottky | Diodes Inc. | SD103B | 2 |
| D5 | 6.2V Zener Diode | NSC | 1N5234B | 1 |
|  | ALTERNATE MFR'S: | Motorola |  |  |
| F1 | .18A PTC | Raychem | TR250-180U | 1 |
| MOV1 | 300V MOV | CKE | Z300LA4 | 1 |
|  | alternate: | Panasonic | ERZ-C07DK471U |  |
| MOV2,MOV3 | 60V MOV | Panasonic | ERZ-C07DK101 | 2 |
|  | alternate: | CKE | Z7L101 |  |
| P1 | Socket 5 × 2 | Samtec | SLW-105-01-G-D | 1 |
| R1 | 787K 1/4W 1% |  |  | 1 |
|  | ALTERNATE: | Yageo | MF-25-B-787K |  |
|  | ALTERNATE: | RCD | GP-55-787KÓ-1%-B |  |
|  | ALTERNATE MFR's for all resistors: Kamaya |  |  |  |
| R3 | 3.92K 1/4W 1% |  |  | 1 |
|  | ALTERNATE: | Yageo | MF-25-B-3.92K |  |
|  | ALTERNATE: | RCD | GP-55-3.92KÓ-1%-B |  |
| R4 | 26.7K 1/4W 1% |  |  | 1 |
|  | ALTERNATE: | Yageo | MF-25-B-26.7K |  |
|  | ALTERNATE: | RCD | GP-55-26.7KÓ-1%-B |  |
| R5 | 47.5 OHM 1/4W 1% |  |  | 1 |
|  | ALTERNATE: | Yageo | MF-25-B-47.5 |  |
|  | ALTERNATE: | RCD | GP-55-47.5Ó-1%-B |  |
| R6 (Opto-B) | 59.0K 1/4W 1% |  |  | 1 |
|  | ALTERNATE: | Yageo | MF-25-B-59.0K |  |
|  | ALTERNATE: | RCD | GP-55-59.0KÓ-1%-B |  |
| R6 (Opto-C) | 52.3K 1/4W 1% |  |  | 1 |
|  | ALTERNATE: | Yageo | MF-25-B-52.3K |  |
|  | ALTERNATE: | RCD | GP-55-52.3KÓ-1%-B |  |
| R6 (Opto-D) | 48.7K 1/4W 1% |  |  | 1 |
|  | ALTERNATE: | Yageo | MF-25-B48.7K |  |
|  | ALTERNATE: | RCD | GP-55-48.7KÓ-1%-B |  |
| R6 (Opto-E) | 43.2K 1/4W 1% |  |  | 1 |
|  | ALTERNATE: | Yageo | MF-25-B-43.2K |  |
|  | ALTERNATE: | RCD | GP-55-43.2KÓ-1%-B |  |
| R6 (Opto-F) | 35.7K 1/4W 1% |  |  | 1 |
|  | ALTERNATE: | Yageo | MF-25-B-35.7K |  |
|  | ALTERNATE: | RCD | GP-55-35.7KÓ-1%-B |  |

TABLE A-continued

Parts List - Circuit Board 1

| DESIGNATOR | DESCRIPTION | MFR | MFR # | Qty |
|---|---|---|---|---|
| R6 (Opto-H) | 31.6K 1/4W 1% | | | 1 |
| | ALTERNATE: | Yageo | MF-25-B-31.6K | |
| | ALTERNATE: | RCD | GP-55-31.6KÓ-1%-B | |
| R2,R11 | 6.81K 1/4W 1% | | | 2 |
| | ALTERNATE: | Yageo | MF-25-B-6.81K | |
| | ALTERNATE: | RCD | GP-55-6.81KÓ-1%-B | |
| R12 | 3.32K 1/4W 1% | | | 1 |
| | ALTERNATE: | Yageo | MF-25-B-3.32K | |
| | ALTERNATE: | RCD | GP-55-3.32KÓ-1%-B | |
| R13 | 24K 1/8W 5% | | | 1 |
| | ALTERNATE: | Yageo | CR-12-B-24K | |
| | ALTERNATE: | RCD | CF-12-24KÓ-5%-B | |
| R14,R22 | 10K 1/8W 5% | | | 2 |
| | ALTERNATE: | Yageo | CR-12-B-10K | |
| | ALTERNATE: | RCD | CF-12-10KÓ-5%-B | |
| R18 | 56K 1/8W 5% | | | 1 |
| | ALTERNATE: | Yageo | CR-12-B-56K | |
| | ALTERNATE: | RCD | CF-12-56KÓ-5%-B | |
| R21 | 510 Ohm, 1W, 5%, MO | Panasonic | P510W-1 | 1 |
| R23 | 9.1K, 1/8W, 5% CF | | 9.1KE | 1 |
| T1 | Power Transformer | PREM | # 7224 | 1 |
| U1 | op-amp | TI | LM358P | 1 |
| | ALTERNATE MFR'S: | National | | |
| U2 | Photo-Isolator | Siemens | IL300 | 1 |
| U3 | Op Amp | TI | TLC2272CP | 1 |
| | ALTERNATE: | National | LMC6082 | |
| U4 | RMS-DC conv | Maxim | AD536AJN | 1 |
| U5 | EEPROM | Xicor | X24C04P | |
| | ALTERNATE | Signetics | PCF8582AP | 1 |
| VR1 | 5V regulator | National | LM2931T-5.0 | 1 |
| VR2 | 5V regulator | National | LM2931Z-5.0 | 1 |

TABLE B

Parts List - Circuit Board 2

| DESIGNATOR | DESCRIPTION | MFR. | MFR.# | Qty |
|---|---|---|---|---|
| C1,C2,C3,C6,C8,C10 C11,C12,C13,C15,C16 C17,C18,C21,C22 | 0.1uF 50V MLC ALTERNATE: ALTERNATE: | Philiips Phillips Mallory | CY20C104MTP CW20C104M M20R104M5 | 15 |
| C4,C5 | 22pF disk, 50V | Panasonic | ECU-S2A220JCA | 2 |
| | ALTERNATE: | Mepco | CN-15A220K | |
| | ALTERNATE: | Mallory | GE220K | |
| | ALTERNATE: | Mallory | CEC220J | |
| C7,C9,C14,C19 | 10uF,tant, 16V | Nemco | TB/10/16V/10% | 4 |
| | ALTERNATE: | Matsuo | 202L1602106K4 | |
| | ALTERNATE: | Sprague | 199D106X9016CA1 | |
| | ALTERNATE: | Phillips | 41GS106C0116K0AV | |
| | ALTERNATE: | AVX | TAP106K016SP | |
| C20 | 10uF 50V | NIC | NRSA10M63V | 1 |
| | ALTERNATE: | Nichicon | UVX1J100MDA | |
| | ALTERNATE: | Panasonic | ECE-A1HU100 | |
| | ALTERNATE: | Phillips | 3476CB100M050JMB | |
| D1 | rect diode | Diodes Inc | 1N4148 | 1 |
| | ALTERNATE MFR'S: | Motorola, Phillips, | | |
| D2 | rect diode | Diodes Inc | 1N4001 | 1 |
| | ALTERNATE MFR'S: | Motorola, General | | |
| J1 | 10 pin header | Samtec | TSW-105-21-G-D | 1 |
| J2 | Connectors to displ. bd. | Samtec | DW-01-07-G-S-250 | 5 |
| Q1 | 2N3904 | Motorola | 2N3904 | 1 |
| | ALTERNATE MFR'S: | Phillips, National | | |
| Q2 | Virtual Ground | TI | TLE2425CLP | 1 |
| | ALTERNATE MFR's for all | | | |
| R1,R15,R16 | 100K 1% 1/4W | | | 3 |
| | ALTERNATE: | Yageo | MF-25-B-100K | |
| | ALTERNATE: | RCD | GP-55-100KÓ-1%-B | |
| R2 | 28.7K 1% 1/4W | | | 1 |
| | ALTERNATE: | Yageo | MF-25-B-28.7K | |
| | ALTERNATE: | RCD | GP-55-28.7Ó-1%-B | |
| R3 | 5.1K 1/4W 5% | | | 1 |
| | ALTERNATE: | Yageo | CR-25-B-5.1K | |
| | ALTERNATE: | RCD | CF-25-5.1KÓ-5%-B | |

TABLE B-continued

Parts List - Circuit Board 2

| DESIGNATOR | DESCRIPTION | MFR. | MFR.# | Qty |
|---|---|---|---|---|
| R4 | 20K 1/4W 5% | | | 1 |
| | ALTERNATE: | Yageo | CR-25-B-20K | |
| | ALTERNATE: | RCD | CF-25-20KÓ-5%-B | |
| R5,R8 | 10K 5% 1/4W | | | 2 |
| | ALTERNATE: | Yageo | CR-25-B-10K | |
| | ALTERNATE: | RCD | CF-25-10KÓ-5%-B | |
| R6,R7 | 2.2K 5% 1/4W | | | 2 |
| | ALTERNATE: | Yageo | CR-25-B-2.2K | |
| | ALTERNATE: | RCD | CF-25-2.2KÓ-5%-B | |
| R9,R10,R11 | 220 ohm 5% 1/4W | | | 3 |
| | ALTERNATE: | Yageo | CR-25-B-220 | |
| | ALTERNATE: | RCD | CF-25-220Ó-5%-B | |
| R12 | 20K 5% 1/4W | | | 1 |
| | ALTERNATE: | Yageo | CR-25-B-20K | |
| | ALTERNATE: | RCD | CF-25-20KÓ-5%-B | |
| R13 | 39 ohm 5% 1/4W | | | 1 |
| | ALTERNATE: | Yageo | CR-25-B-39 | |
| | ALTERNATE: | RCD | CF-25-39Ó5%-B | |
| R14 | 1M 1/4W 5% | | | 1 |
| | ALTERNATE: | Yageo | CR-25-B-IM | |
| | ALTERNATE: | RCD | CF-25-1MÓ-5%-B | |
| U1 | Power Control | Linear Tech | LTC690CN8 | 1 |
| | ALTERNATE: | Maxim | MAX690ACPA | |
| U2 | RS232 comm. chip | Maxim | MAX202ECPE | 1 |
| | ALTERNATE: | Linear Tech | LT1081CN | |
| U3 | Microcontroller | Signetics | S80C552-1A68 | 1 |
| U4 | latch | National | MM74HC573 | 1 |
| | ALTERNATE MFR'S: | Motorola, TI, Harris, | | |
| U5 | 64K EPROM | NEC | D27C512-20J | 1 |
| | ALTERNATE MFR'S: | TI | | |
| U6 | 32K RAM | Sony | CXK58257ASP-10L | 1 |
| | ALTERNATE: | Sony | CXK58257ASP-12L | |
| | ALTERNATE: | Mitsubishi | M5M5256BKP-12LL | |
| | ALTERNATE: | Mitsubishi | M5M5256BKP-10LL | |
| U7 | real time clock | Epson | RTC72421A | 1 |
| U8 | NAND | National | MM74HC00N | 1 |
| | ALTERNATE MFR'S: | Harris, Motorola, TI, | | |
| X1 | crystal 7.3728 MHz | | MP1-7.3728MHZ | 1 |
| | ALTERNATE MFR'S: | CTS, ECS, MPC | | |
| | 28 pin DIP socket | DuPont | ICA286STT | 1 |
| | PLCC socket | DuPont | 69394-68 | 1 |

TABLE C

Parts List - Circuit Board 3

| DESIGNATOR | DESCRIPTION | MFR | MFR# | Qty |
|---|---|---|---|---|
| C1 | 0.1uF 50V | Phillips | CY20C104MTP | 1 |
| | ALTERNATE | Phillips | CW20C104M | |
| | ALTERNATE: | Mallory | M20R104M5 | |
| C2 | 10uF,tant, 16V | Nemco | TB/10/16V/10% | 1 |
| | ALTERNATE: | Matsuo | 202L1602106K4 | |
| | ALTERNATE: | Sprague | 199D106X9016CA1 | |
| | ALTERNATE: | Phillips | 41GS106C0116K0AV | |
| | ALTERNATE: | AVX | TAP106K016SP | |
| LED1,LED2,LED3 | 7-SEG DISPLAYS | QUALITY | FND-317 | 3 |
| | ALTERNATE: | LITE-ON | LTS-367HR | |
| LED4 | BI-COLOR LED | LITE-ON | LTL-52RG | 1 |
| | ALTERNATE: | Sanken | SML1616C | |
| R1 | 220 ohm 5% 1/4W | | | 1 |
| | ALTERNATE: | Yageo | CR-25-B-220 | |
| | ALTERNATE: | RCD | CF-25-220Ó-5%-B | |
| R2 | 20 ohm 5% 1/4W | | | 1 |
| | ALTERNATE: | Yageo | CR-25-B-20 | |
| | ALTERNATE: | RCD | CF-25-20Ó-5%-B | |
| R3 | 36K ohm 5% 1/4W | | | 1 |
| | ALTERNATE: | Yageo | CR-25-B-36K | |
| | ALTERNATE: | RCD | CF-25-36KÓ-5%-B | |
| U1 | DISPLAY DRIVER | MAXIM | MAX7219CNG | 1 |

Table D, below, charts the translation of the input AC voltage magnitude with certain voltage levels within the circuit board for the power portion 496. However, it is readily appreciated by those skilled in the art that the illustrated configuration is made largely for reasons of convenience and practicality, and that variations may be made thereon without departing from the spirit and scope of the present invention.

TABLE D

| PIN | $V_{dc}$ | $V_{LINE(V)}$ | | |
|---|---|---|---|---|
| | | 120 $V_{rms}$ | 250 $V_{rms}$ | 80 $V_{rms}$ |
| U1-1 | 1.74 | 108 mV | 221 mV | 72 mV |
| U1-2,3 | 1.85 | 373 mV | 776 mV | 251 mV |
| U2-2 | 1.23 | 12.6 mV | 26.6 mV | 8.6 mV |
| U3-1 | 2.6 | 540 mV | 1.11 V | 359 mV |
| U307 | — | 1.04 VDC | 2.13 VDC | 691 VDC |

The monitoring unit as described collects information on one 120 VAC RMS line. The continuous operating voltage of the monitoring unit is between 80 and 150V, but the monitoring unit can monitor short duration surge disturbances (less than 1 second) of up to 250 VAC. If the monitoring unit is continuously operated above 150 VAC, damage may occur to the internal transformer. To warn the user that a dangerous voltage is being approached, the LED character display 475 (which indicates the voltage being currently measured, and which is updated once per second) will start flashing and become brighter whenever the voltage being recorded is greater than 135 VAC.

The monitoring unit can record voltage disturbances up to 250 VAC input voltage. As discussed before, if the disturbance lasts for one cycle or longer, the monitoring unit can record the true RMS voltage value of the voltage disturbance. If the duration of the disturbance is less than one cycle, the monitoring unit can record the occurrence of a disturbance. The accuracy of a preferred embodiment of the monitoring unit over the entire measurement range of 80 VAC to 250 VAC is 0.4% of full scale or ±1 volt.

In this way, the monitoring unit can monitor large voltage disturbances on a 120V line and record them with a one cycle resolution for reporting to a user at a later time.

Having generally described the structure of the monitoring unit, the particular functions of the monitoring unit, implemented primarily through microprocessor 435, will now be explained. As noted before, for a 60 Hertz signal, the microprocessor 435 samples the waveform values that have been detected by the monitoring portion of the invention a number of times each cycle. The microprocessor 435 then averages those waveform values over various periods of time, to produce a variety of waveform average values.

The microprocessor 435 also recognizes and records particular waveform information, including waveform average values, which may be considered important for the user. Generally, the microprocessor 435 recognizes important information based upon either a voltage range designated as abnormal, or upon report formats including particular information which may be selected by the user. The preferred embodiment of the monitoring unit recognizes waveform information which is employed by any one of nine different types of reports: a graph summary report, a strip chart report, an interval report, a histogram report, a power outage report, an abnormal report, an out of limits report, a significant change report, and a flicker report. Each of these reports will be discussed in more detail below.

Returning to the averaging function of the microprocessor 435, this function will now be explained in greater detail. The microprocessor 435 determines a one cycle average, a one second average, a one minute average, and a fifteen minute average. As discussed before, for a 60 Hz waveform, the RMS-to-DC converter 424 produces a DC output voltage proportional to the RMS value of the input waveform. In a preferred embodiment, the RMS-to-DC converter 424 operates with a one cycle response time. The microprocessor 435, through the ADC 430, samples the DC output voltage several times per cycle, and averages the values of the DC output over one cycle to obtain a one cycle average.

After obtaining 60 one cycle averages, that is, after obtaining one second of one cycle averages, the microprocessor then averages all of the one cycle averages together to determine a one second average. It should be noted that this one second average is then used to update the voltage shown on the monitoring unit's character display 475. Also, the worst case maximum and worst case minimum one cycle averages for each one second period are temporarily stored for use, where applicable, with the significant change report, the flicker report, and the abnormal voltage report, as will be explained in greater detail below.

The one second averages are collected for one minute. After one minute, all of the one second averages previously calculated are averaged together to determine a one minute average. This one minute average is then used in the voltage histogram and abnormal histogram graphs in the graph summary report. The one minute average is also used in the voltage histogram report. All three of these reports show the number of one minute averages at each voltage level, as will be explained in greater detail later.

After one minute averages are taken for fifteen minutes, the 15 one minute averages are averaged to obtain a fifteen minute average. This fifteen minute average is used in generating an average daily profile graph in the graph summary report.

In addition to averaging the waveform values over these predetermined periods, the monitoring unit will also average these values over a time period selected by the user. In a preferred embodiment, the user can select an average interval period of 1, 2, 5, 10, or 15 minutes. To obtain these averages, the one second averages are determined over the entire selected interval. At the end of each selected interval period, all of the one second averages then are averaged together to produce an average for the entire selected interval time period. That is, a running sum of the one second voltage averages is repeatedly updated, and this sum is then divided by the number of seconds in the selected period to obtain the average voltage value for the selected interval period.

It should be noted that both the sampling rate and the averaging intervals discussed herein correspond only to one preferred manner of implementing the invention. It will be understood by those of ordinary skill in the art that other sampling rates and averaging intervals may be selected for alternate embodiments of the invention. For example, the sampled voltage values could be averaged together to determine a thirty second average, a seven minute average, etc. It is an object of the invention to sample (and average) voltage values frequently enough to allow the user to determine the quality of the power supply being monitored. Thus, while averaging intervals of one cycle, and 1, 2, 5, 10 and 15 minutes are expressly disclosed, the averaging interval may most preferably be any interval less than 15 minutes. Further, depending upon the intended use of the embodiment of the invention, the averaging interval may be any interval up to an hour. Also, it is contemplated that, under some circumstances, the averaging interval may be any interval greater than an hour and less than a day.

Similarly, it will be understood that the sampling rate can likewise be changed without departing from the spirit and scope of the invention. For example, while the sampling rate is most preferably more than once per cycle, the sampling rate may also preferably be any rate between once per cycle and once per minute. Alternatively, for some embodiments of the invention, the sampling rate may be any rate between once per minute and once per hour.

Returning now to the particular embodiment of the invention disclosed herein, it should be noted that the worst case maximum and minimum one cycle average for each selected interval period are also recorded. The interval average, the worst case one cycle minimum and the worst case one cycle maximum for each selected interval are employed in the strip chart or interval data reports for each interval.

As discussed, the microprocessor 435 recognizes waveform information which may be considered important to a user, based upon whether the information would be included in any one of nine different types of reports selectable by the user. The microprocessor 435 will then display important waveform information, store recognized waveform information, or both.

For example, as previously mentioned, the monitoring unit displays each one second average voltage on character display 475. In addition, the microprocessor recognizes abnormal voltage levels, which are then immediately indicated on the LED 477. More specifically, microprocessor 435 recognizes abnormal voltages out of two possible ranges of abnormal voltages, an inner range or low limit, and an outer range or high limit. For the preferred embodiment, each range is centered on 120 VAC, the nominal operating voltage for the preferred embodiment. Each range consists of a voltage deviation band, plus and minus, from the center nominal voltage.

The low limit or inner range specifies the voltage beyond which a low limit abnormal voltage has occurred. The high limit or outer range specifies the voltage beyond which a high limit abnormal voltage has occurred. With the preferred embodiment, the default range for the lower limit is ±6V, or 126V to 114V, while the default range for the high limit is ±12V, or 132V to 108V. However, both the low and high limit abnormal voltage ranges are user adjustable through the serial communication port 455. The last ranges selected by a user before a new recording session is started will be used by the monitoring unit for that recording session. The maximum voltage range is ±40V for the high range. The low range must always be less than or inside the high range.

Recognition of abnormal voltages is also controlled by the abnormal trigger. The abnormal trigger is the amount of time in consecutive seconds that the detected voltage must be outside either the high limit or the low limit for the detected voltage to be considered abnormal. The abnormal trigger can be adjusted by the user through the communication port 455. The abnormal trigger can be adjusted from 1 to 20 seconds, but the default trigger period is 5 seconds. The abnormal trigger is sent to the monitoring unit at the time of initialization.

After the monitoring unit obtains a one second average, this average is compared to the high and low limit settings. If the one second sample is outside of the high or low limits, a counter is incremented for the appropriate limit. Of course, exceeding the high limit also means that the low limit has been exceeded. If the one second sample is not outside of either limit, both counters are reset to zero. If either counter is equal to the abnormal trigger, the abnormal LED indicator 477 will light. If a low limit abnormal voltage occurs, the LED indicator 477 will light green. If a high limit abnormal voltage occurs, the LED indicator will light red. In either case, the time and date of the event will be recorded in RAM 440, for use in one or more of the nine reports.

The nine reports will now be explained in detail. Because these reports are intended to provide a convenient method of analyzing the power waveform monitored by the monitoring unit, the report formats dictate the waveform information that is to be recognized and recorded by the monitoring unit. This waveform information can later be compiled into one or more of these reports by a separate analysis program.

A The graph summary report includes an average daily profile report, nominal and abnormal voltage histograms, and summary information. The average daily profile report employs the fifteen minute average values for each fifteen minute interval during a recording period. Thus, each recording day will include ninety-six recording periods. To produce the report, the fifteen minute average from each period is averaged with the fifteen minute average from that same period for each day the unit is recording. That is, for a two day recording session, the fifteen minute average for the interval of the first period of day one is averaged with the fifteen minute average for the interval of the first period of day two. The information is actually stored in RAM 440 as the total voltage and the number of data points (days) included in that total. The analysis program then averages the total voltage for each recording period to construct a graph profiling daily voltage trends.

The voltage histograms include the number of minutes the average voltage was at each voltage level over the measurement range of the monitoring unit during the recording session. Accordingly, the voltage histograms employ the one minute averages calculated by the monitoring unit for each minute of the recording period. The unit determines or rounds each one minute average value to the nearest whole volt, and then increments the number of minutes in the histogram for that voltage by one. The nominal voltage histogram includes a summary of the number of rounded, one minute averages that were recorded at each voltage level during the recording period. The analysis program can then prepare the abnormal voltage histogram by summarizing the number of rounded, one minute averages that deviated from the nominal voltage (typically 120 volts) by five percent or more.

With the strip chart report, the analysis program produces three separate graphs, an average voltage graph, a maximum voltage graph, and a minimum voltage graph. The strip chart report is based upon the variable interval selected by the user. For the strip chart report, the unit determines or rounds the interval average voltage value to the nearest whole volt, and this rounded interval average value is employed in the strip chart report.

The average voltage graph illustrates the average voltage value for each interval in the recording period, whereas the maximum voltage graph displays the worst case, one cycle average maximum voltage for each interval. The worst case, one cycle average minimum voltage for each interval is shown on the minimum voltage graph.

The interval report employs the same waveform information as the strip chart report and is based upon an interval time period selected by the user. However, the interval report provides this waveform information in a tabular form rather than a graphic form. Accordingly, the interval report also requires the average voltage value for each interval in the recording period, the worst case, one cycle average maximum voltage for each interval, and the worst case, one cycle average minimum voltage for each interval.

The histogram report generates a table of all the one minute average voltage levels that fall within the monitoring unit's recording range, and the amount of time that the average recorded voltage was at each level.

The power outage report indicates the time that power is lost and the time power returns for the most recently recorded twenty-nine power outages. If the input voltage falls below 80V for 300 msec or longer, the monitoring unit stops recording and considers that event a power outage. The monitoring unit will then time stamp and date such an occurrence, and store the occurrence in RAM 440. In a preferred embodiment of the monitoring unit, the power outages are recorded with a one second resolution.

As previously discussed, the monitoring unit recognizes voltages outside of an inner range and an outer range as abnormal. The abnormal voltage report indicates the time and date that these abnormal voltages, both low limit and high limit, occurred. The report also includes the values for the low limit range, the high limit range, and the abnormal trigger.

The out of limits report, compiled by the analysis program, includes the average value, the maximum value, and the minimum values for each interval. The report will inform the user when any recorded values are outside a range the user specifies at the time of generating the report. The report indicates the actual voltage recorded and the interval in which the recording was made. It should be noted that the maximum and minimum values used in this report can be based solely on a one cycle average in each interval.

The significant change report indicates to the user any time the voltage changes more than a preset amount. This preset amount, or "threshold" amount, is in whole volt increments from 1 to 8 volts, and can be varied by the user. When a new recording session is started, the monitoring unit proceeds through a one minute countdown, as will be subsequently explained in more detail. The voltage average obtained during the one minute countdown becomes the standard voltage to which all other voltages will be compared, until an absolute difference of equal or greater value than the threshold amount is detected. As discussed, the unit takes multiple samples every cycle to obtain a one cycle average. Once per second, all of the one cycle averages are averaged to obtain a one second average. Also, the worst case one cycle sample for each second is compared to the previously established standard.

If the difference between the samples is equal to or greater than the threshold, then a significant change event has occurred. The worst case one cycle sample for that second is recorded in the report along with the date and time, including the second, at which this significant event occurred. That worst case one cycle sample now becomes the standard. All other worst case one cycle samples from each second are compared to the new standard until the absolute difference between the standard and the one cycle sample is equal to or greater than the threshold amount. It is important to note that the significant change report data is determined on the basis of the worst case one cycle sample for each second.

Because the significant change report will indicate when the voltage changes by more than the threshold amount, it can be useful in determining how long a voltage disturbance lasted. When the threshold amount is exceeded, the monitoring unit records when the surge starts and when the surge ceases and the voltage returns to normal values. Simply subtracting the two times gives the user a good approximation of how long the voltage disturbance lasted.

The final report employed by the preferred embodiment of the monitoring unit is the flicker report. Flicker is considered to be a voltage disturbance that is visibly noticed, usually as flickering lights, by the electric utility customer. Flicker events are usually categorized as noticeable events or as objectionable events. Noticeable events are those which can be seen by the customer, but which would not cause the customer to complain. Objectionable events are those which can be seen by the customer and would be unacceptable to the customer.

Each flicker curve usually consists of two separate lines. The first line is called the borderline of perception. Flicker events which are below the borderline of perception cannot be seen by the customer. The second line is called the borderline of irritation. The area between the borderline of perception and the borderline of irritation defines flicker events which can be seen by the customer but which are not unacceptable to the customer. Flicker events that fall beyond the borderline of irritation are those events which can be seen by the customer and cause the customer some concern.

Flicker is measured in the monitoring unit as voltage fluctuations in preset time periods, and may be recorded as events depending on the number of fluctuations and the percentage change of each of those fluctuations in the preset time periods. Many small fluctuations occurring over a small time period (seconds or minutes) may be objectionable to the customer, while several small fluctuations occurring over a 24 hour period would not be objectionable to the customer. Larger fluctuations occurring over the same 24 hour period may, however, be objectionable to the customer.

The monitoring unit is preset to report flicker events for nine different fixed time periods. The time periods range from 10 seconds to 24 hours. For each of these time periods, the user can adjust the threshold percentage change, from the last one second voltage average recorded, of the voltage levels that are to be recognized for the flicker report. The user can also adjust the number of occurrences, called the frequency limit, required for the fluctuations measured to be included in the flicker report. If the monitoring unit measures a sufficient number of fluctuations, enough to exceed the user set frequency limit, which met or exceeded the threshold percentage, the monitoring unit recognizes that a flicker event has occurred. The monitoring unit will then record the event for the flicker report. Each recorded flicker event will include a time and date stamp, and will report the exact number of fluctuations that were measured during the time period in which the flicker event occurred.

The flicker report can be used by electric utility companies to record the occurrence of voltage fluctuations which may be objectionable to their customers. The flicker report of the monitoring unit can be helpful by correlating objectionable flicker occurrences to possible sources of the voltage fluctuations. The electric utility may be able to correlate flicker events to the customer's changing load characteristics.

The user usually will typically setup the monitoring unit to report fluctuations that are on or beyond the borderline of irritation. It is anticipated that each user will probably have his own definition of the borderline of irritation, and the analysis program allows the user to configure the monitoring unit through the communication port 455 to report flicker events based on any flicker curve. The user can adjust the frequency limit and the threshold percentage for each of the nine preset time periods to match any desired curve on the flicker chart. The default curve for the monitoring unit is based on the borderline of irritation of IEEE Flicker curve ANSI STD. 141.

It should be noted that the monitoring unit can be used to conduct both long and short term voltage surveys. Short term surveys are surveys in which the monitoring unit is setup to record for a period of less than one week. Long term surveys are recording sessions in which the monitoring unit is setup to record for longer periods, from one week to over a year. The user would typically configure the monitoring unit for long and short term surveys, depending on the detail required by the user and the purpose of the recording session.

The user may want to do a short term survey when finer details of the voltages being measured are needed. The averaging period or interval can be adjusted for the interval and strip chart reports through the communication port 455. The smaller the interval, the more often a maximum, minimum, and average voltage will be recorded. Adjusting the interval does not affect the sampling rate of the monitoring unit, but it does affect how often that data will be averaged. With a small interval period, the monitoring unit interval report will contain more data for a short recording session than it would if it were set up for a larger interval. The significant change report can also be used for longer term voltage studies (months at higher threshold settings) or for higher resolution short term surveys (days or even hours in the presence of frequent disturbances).

The graph summary reports (average daily profile, nominal voltage histogram, and abnormal voltage histogram) are reports for which the amount of data taken is not changed by any change in setup of the monitoring unit. These reports can be used to collect data for over one year before the storage space for the data is exhausted. These reports are statistical reports and are meant to show the user the spectrum of operating voltages during the entire recording session.

It should be noted, however, that because the internal space to store the interval data is limited, it is necessary to point out that once the space provided for interval data is full, the monitoring unit will keep recording interval data while overwriting the oldest data to make space for the new data. For example, if the monitoring unit is set to record for the smallest interval of one minute, it will record five days of data before overwriting any old interval data. After five days, the monitoring unit will begin to overwrite the earliest data recorded on the first day.

The structure of the monitoring unit having been described above, the operation of the monitoring unit, as well as various advantageous uses and benefits, will now be described with reference to the flowcharts shown in FIGS. 9–12.

When the monitoring unit is first powered, it enters a countdown state. The purpose of the countdown state is to provide a one minute buffer time between initialization of the unit and subsequent recording. During the countdown state, the user may still download the previous recording session's data, or disconnect the unit and reconnect it at another location, without disturbing the next recording session. While in the countdown state, the unit displays the running sixty second counter.

The countdown state is entered after a unit is initialized and the serial cable is removed. If the unit is removed from power with the serial cable still connected, then the countdown state is entered immediately upon the next power up. At the beginning of the countdown state, a counter is loaded with a time of sixty seconds. This is decremented once a second. If power is removed while in the countdown state, the unit will restart the sixty second timer upon subsequent powerup. When the counter reaches zero, the unit enters the recorder state. The unit is monitoring one second voltage averages during the entire countdown state, and the display flashes if the voltage rises past 135 Volts RMS during the sixty second period.

Figure 9:
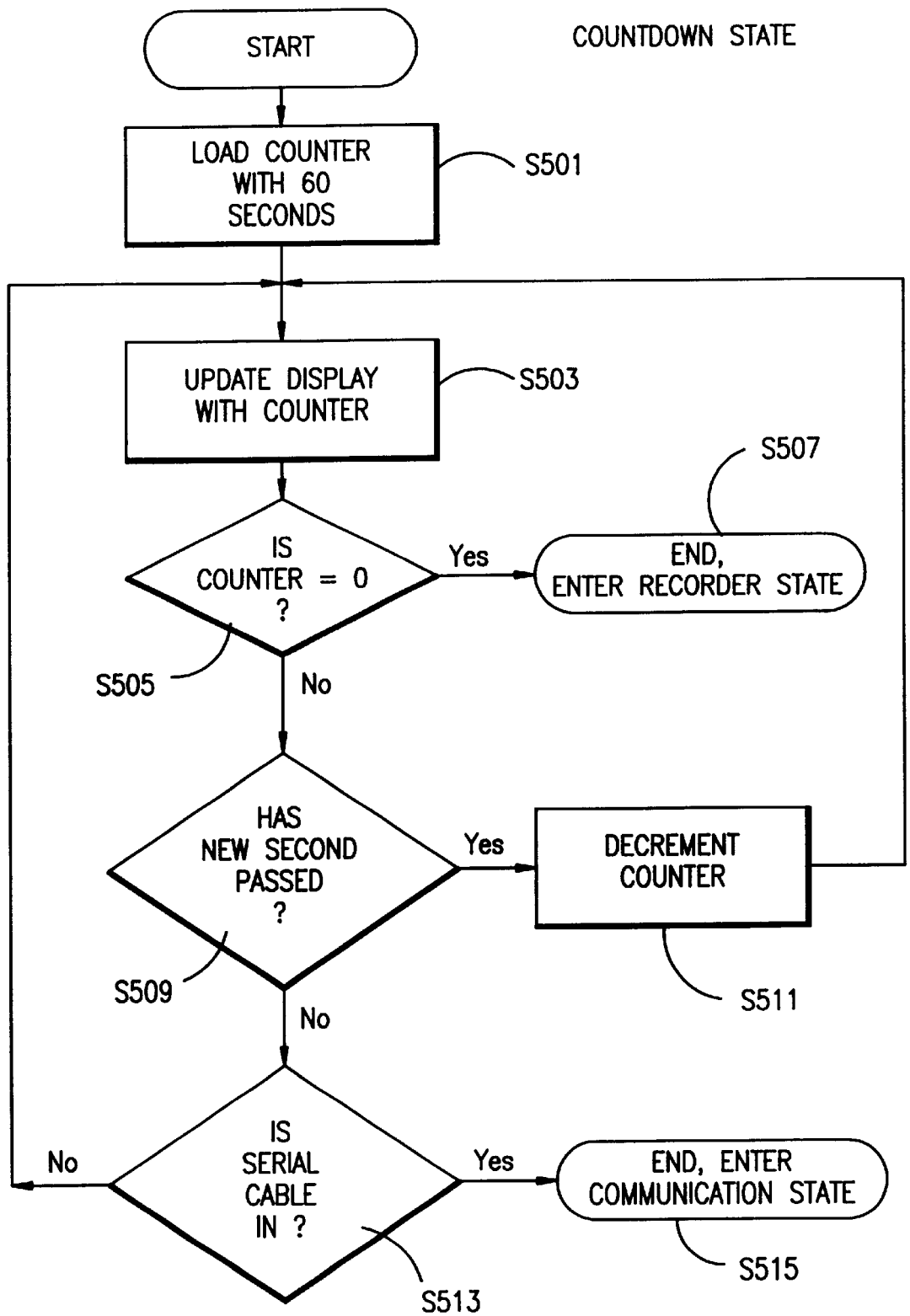
FIG. 9 is a flowchart illustrating the operation of an embodiment of the invention during a countdown state.

The particular operation of the monitoring unit during the countdown state will now be described with reference to FIG. 9. In step S501, the internal countdown counter in microprocessor 435 is loaded with sixty seconds. This counter determines the length of the countdown state. In step S503, the current counter value is displayed on the front panel LED character display 475. Next, in step S505, the counter is checked to see if the value stored in the counter is equal to zero. If the counter has expired, then the countdown state ends, and the monitoring unit enters the recorder state in step S507.

If the counter has not expired, the monitoring unit checks to see if a new second has occurred in step S509. This is done in order to time the countdown state. When a new second has occurred, the sixty second counter is decremented in step S511. After the counter has been decremented, the monitoring unit returns to step S503 to display and check the new value of the counter.

When a new second has not occurred, in step S513 the monitoring unit checks to see if a communication cable has been inserted into the communication port. In this manner, the monitoring unit repeatedly checks to see if a communication cable is connected to the monitoring unit. If a cable is detected (or, alternatively, if the DTR pin connection has been toggled, as explained below), the monitoring unit then enters the communication state in step S515.

The purpose of the communication state is to implement communications between a control system, such as a host personal computer, and the monitoring unit. Recorded data downloading, unit initialization, and calibration information are handled in this state.

When the monitoring unit is employed as a stand-alone device, the monitoring unit is configured such that the communication state is entered when a communications cable is connected to the communication port, and this state is exited when the cable is removed. However, when the monitoring unit is employed with a communications network, the monitoring unit is configured so that a communications cable, such as a serial cable, may be continuously connected to the monitoring unit.

With the network configuration, the network workstation application toggles the DTR pin connection (pin 2, connector P1 as shown in FIG. 7) from low to high. This places the monitoring device in the communication state, during which the monitoring unit may receive data requests, as explained in greater detail below. When the requests have been completed, the network workstation application toggles the DTR pin connection from low to high, ending the communication state.

The monitoring unit does not monitor line voltage during the communication state. Instead, the monitoring unit repeatedly monitors the communication port 455 for commands from the personal computer. As previously discussed, there are commands for setting recording parameters and initializing the unit. There are also commands for retrieving current recording settings, uploading data, and transferring calibration data.

Figure 10:
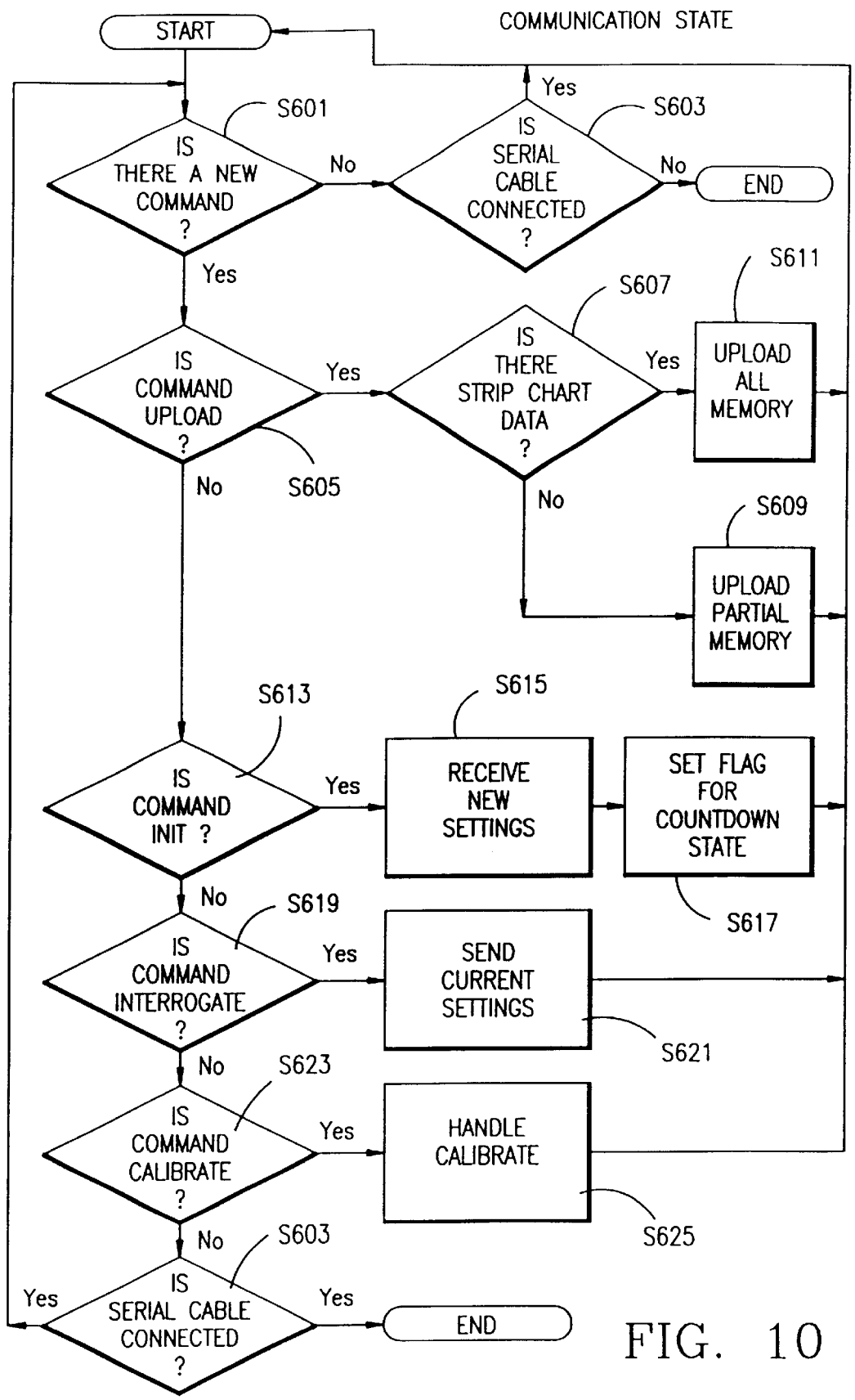
FIG. 10 is a flowchart illustrating the operation of an embodiment of the invention during a communication state.

In the communication state, as illustrated in the flowchart of FIG. 10, the monitoring unit first checks its communication buffer in step S601, to see if a complete command has been received from the personal computer. Reception of individual characters is handled with a low-level interrupt. If a new command has been received, parsing of that command is performed.

If a new command has not been received, the monitoring unit checks to see if the communication cable is still connected in step S603. (With the network configuration, the monitoring device instead checks to see if the DTR pin connection has been toggled.) If the serial cable has been removed (or the DTR pin connection toggled), the communication state is exited. Otherwise, the monitoring unit returns to step S601 to wait for a command.

When a command is received and noted in step S601, the monitoring unit checks in step S605 to see if the received command is the UPLOAD command. If the command is the UPLOAD command, the monitoring unit then checks to see if stripchart data has been recorded in step S607. If stripchart data is not recorded, the monitoring unit only performs a partial upload to the host computer in step S609. Otherwise, if stripchart data is recorded, a full download of recorded data is performed in step S611. In either case, the data is uploaded using a block check sum format, and after the recorded data is downloaded, the monitoring unit returns to step S601 to await another command.

If the received command is not the UPLOAD command, the monitoring unit moves to step S613, where it checks to see if the received command is the INITIALIZATION command. If the received command is the INITIALIZATION command, the monitoring unit begins to receive new initialization settings in step S615. In this step, the monitoring unit receives new recording settings and parameters for the next recording session. Reception of the INITIALIZATION command causes the monitoring unit to enter the countdown state after leaving the communication state, so a flag for the countdown state is then set in step S617. It should be noted that if the INITIALIZATION command is not received, when the communication state is finally exited, the monitoring unit returns to whatever state it was in before entering the communication state.

If the received command is not the INITIALIZATION command, the monitoring unit next checks, in step S619, to see if the received command is the INTERROGATE command. If it is, the monitoring unit then begins to send its current settings in step S621. That is, the monitoring unit then sends its current recording settings and parameters.

If the received command is not the INTERROGATE command, the monitoring unit proceeds to step S623, to see if the received command is the CALIBRATE command. If the received command is the CALIBRATE command, the monitoring unit then begins to prepare to receive calibration commands in step S625. That is, the monitoring unit prepares for calibration commands, which include loading calibration tables, writing tables into the EEPROM 437, and returning raw A/D values to the host computer.

Finally, if the received command is not the CALIBRATE command, the monitoring unit returns to step S603 to see if the communication cable is still connected (or if the DTR pin connection has been toggled).

Figure 11:
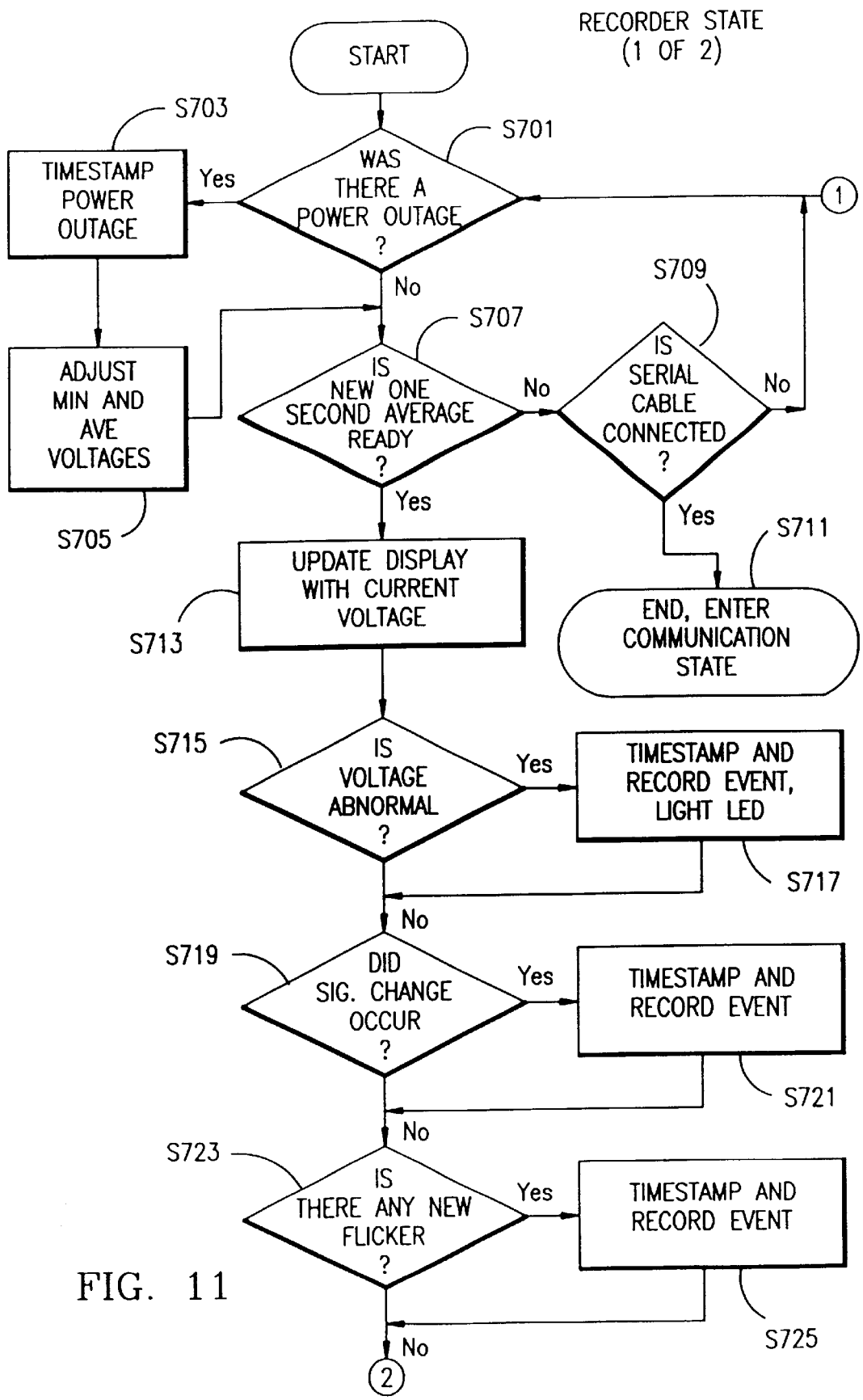
FIGS. 11 and 12 are flowcharts illustrating the operation of an embodiment of the invention during a recording state.
Figure 12:
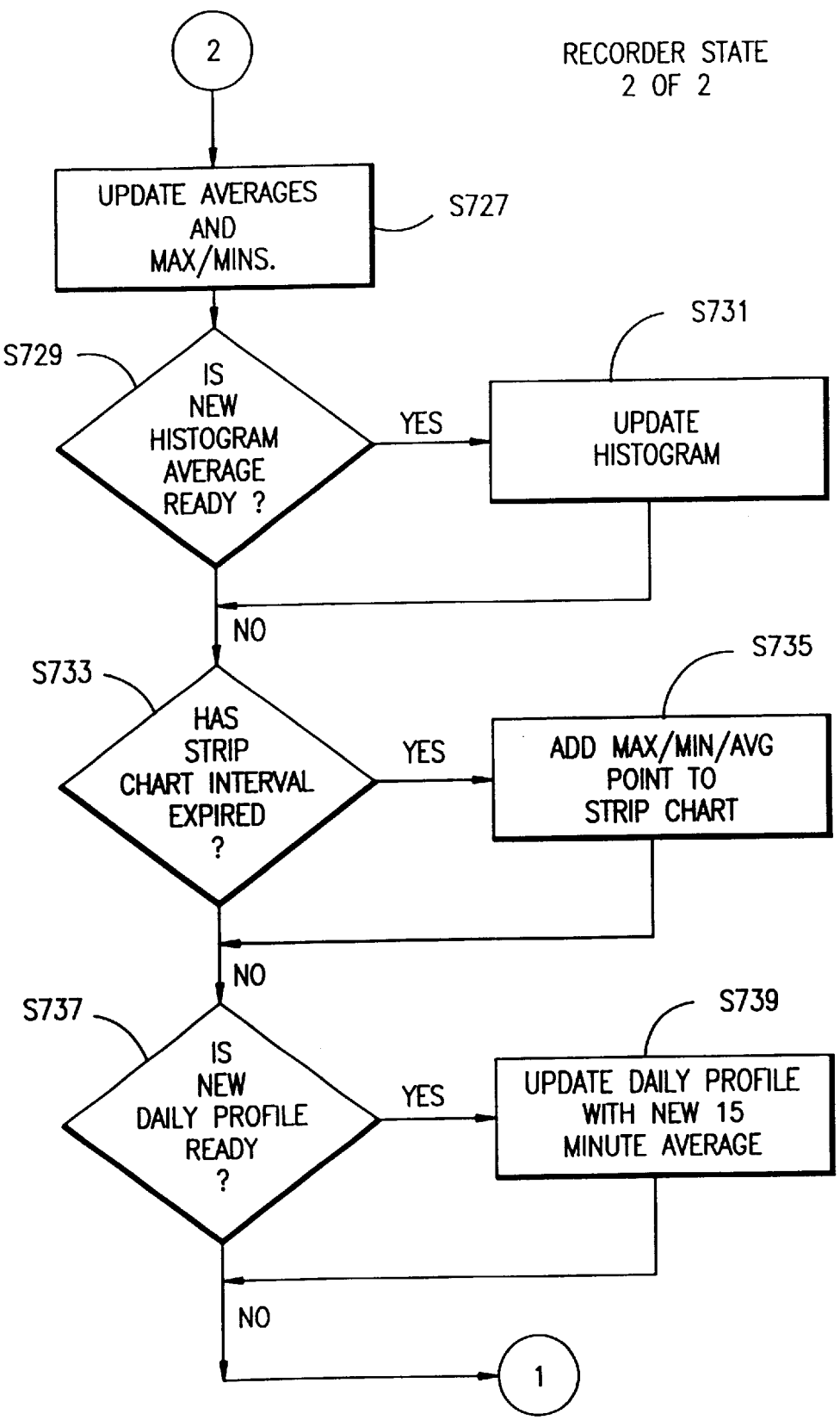

The recorder state of the monitoring unit will now be explained with reference to FIGS. 11 and 12. The recorder state is the primary state of the monitoring unit. In this state, the monitoring unit monitors the RMS AC line voltage, timestamps power outages, voltage abnormalities, and other voltage variations, and records one cycle maximum, minimum, and long term average stripcharts.

If this state is entered from a power outage condition, a power outage is time stamped and recorded. After entering the recorder state, the monitoring unit's background interrupt process repeatedly compiles a one cycle maximum, one cycle minimum, and one second average AC RMS voltage values. The maximum and minimum are the extreme one cycle averages for that second. These readings are passed to the foreground process where they are further processed and recorded. Processing includes updating the front panel display, checking for abnormal voltage conditions, significant change, and flicker, and updating running averages and statistics for stripchart data, the one minute histogram, and the daily profile. The process repeats when the monitoring unit finishes processing the data and begins waiting for the next maximum, minimum, and average value. If a communication cable is plugged into the communication port, the monitoring unit leaves the recorder state and enters the communication state.

The recorder state is entered either after the countdown state or on powerup if the monitoring unit was previously in the recorder state. If a powerup caused the unit to re-enter the recorder state, a power outage has occurred, which needs to be recorded. Accordingly, in step S701, the monitoring unit checks to see if a power outage has occurred. If a power outage has occurred, the power outage start and stop time is recorded to the nearest second in step S703. If the maximum number of outages has been recorded, the oldest outage record is deleted to make room for the new outage record. Next, the minimum recordable voltage is entered as the one cycle minimum for the next stripchart voltage point. Daily profile data and other averages are adjusted appropriately in step S705, to take into account the outage time. This post processing is necessary since the unit is powered from the line it is monitoring.

Whether or not a power outage has occurred, the monitoring unit proceeds to step S707, where it checks to see if a new one second average is ready. Here, the monitoring unit's foreground process waits in a program loop, checking to see if the communication cable is connected in step S709. If the cable is connected, the monitoring unit enters the communication state in step S711. Otherwise, the monitoring unit continues to loop, waiting for the next one second average AC RMS value, and the one cycle minimum and maximum for that second. These values are computed by a low-level background interrupt routine. When the values are ready, the monitoring unit processes the new data.

Next, in step S713, the monitoring unit displays the new one second RMS AC voltage on the front panel LED character display 475. If the voltage is over 135 Volts RMS, the display flashes.

In step S715, the monitoring unit checks to see if the voltage is abnormal. If the abnormal voltage conditions are met, an abnormal voltage event is timestamped and recorded in step S717. The abnormal voltage LED 477 on the front panel is also lit green or red to indicate the condition. This LED 477 stays lit until the unit is initialized for the next recording session.

As discussed, if the one second average voltage is greater than the low limit plus the nominal voltage, or lower than the low limit minus the nominal voltage for the abnormal trigger time (in consecutive seconds), a low limit abnormal voltage event has occurred. This causes the abnormal voltage LED 477 to light and stay green for the rest of the recording session. The first time this event happens, it is timestamped and recorded in RAM 440. Similarly, if the one second average voltage is greater than the high limit plus the nominal voltage, or lower than the high limit minus the nominal voltage for the abnormal trigger time (in consecutive seconds), a high limit abnormal voltage event has occurred. This causes the abnormal voltage LED 477 to light and stay red for the rest of the recording session. The first time this event happens, it is timestamped and recorded in RAM 440. If the abnormal LED 477 has turned red, subsequent low limit abnormal events do not cause it to turn green. However, a high limit abnormal event lights the abnormal LED 477 red regardless of the LED's previous state.

Next, the monitoring unit checks to see if a significant change has occurred in step S719. If the significant change conditions are met, the monitoring unit records the relevant voltage RMS value and timestamps the event in step S721. If the maximum number of significant change records has been reached, the oldest record is deleted to make room for the new record. If any of the one cycle maximum, minimum, or one second average voltage differs from the current significant change standard voltage by at least the threshold voltage, a significant change event has occurred. The voltage with the largest deviation (either the one cycle maximum or minimum, or the average) is recorded along with a timestamp. The recorded voltage becomes the new standard for the next significant change check. For the first second of a recording session, 120 volts RMS is used as the standard. The threshold amount is setable from the host computer.

Next, the monitoring unit checks to see if a new flicker has occurred in step S723. If the user setable flicker conditions are met, the monitoring unit records a new flicker event at step S725. Recorded for the event is a timestamp, the number of voltage flicker occurrences, and the flicker time period in which they occurred.

As previously discussed, the monitoring unit monitors voltage flicker for nine individual time periods, ranging from ten seconds to twenty-four hours. Each of the nine time periods has its own setable threshold, based upon a percentage voltage variation, which is used to determine whether flicker has occurred. For example, if the percentage is set to 2%, any voltage variation of 2% or more from the previous second to the current second would count as a flicker occurrence. Each of the nine time periods also has its own user setable flicker limit, i.e., the number of occurrences. For each time period, the number of individual voltage flicker occurrences must exceed the flicker limit in the space of that time period to be recorded as a flicker event. A flicker occurrence can be based on either a voltage variation of a one second average or one cycle maximum or minimum. The value that represents the greatest variation from the previous reference voltage becomes the new reference voltage for the next flicker check, which happens at the next second, when the monitoring unit has a new one second average and one cycle maximum and minimum.

Next, the monitoring unit updates the various long term averages and statistics in step S727. The new one cycle maximum and minimum are compared with the current stripchart interval maximum and minimum in order to keep the least and greatest values over the entire interval. The stripchart interval average is updated with the one second average. The one minute histogram running average is also updated.

The monitoring unit then checks to see if a new histogram average is ready, in step S729. If the new histogram average is ready, the one minute histogram and daily profile fifteen minute histogram average is updated in step S731. The one minute histogram average is computed by keeping a running total of one second averages. Every minute, the one minute histogram is updated with the minute average computed from the running average.

Next, the monitoring unit checks to see if the stripchart interval has expired in step S733. If the interval has expired, the one cycle maximum, minimum, and average voltage over the entire interval time is recorded as a new point in the stripchart in step S735. As already mentioned, the interval is setable from the host computer, and ranges from one to fifteen minutes. Stripchart data is stored in one day blocks. If the maximum number of days of the stripchart is about to be exceeded, the first day of stripchart data is deleted to make room for the next recorded day.

The monitoring unit then checks to see if a new daily profile is ready, in step S737. Every fifteen minutes a new average is ready, formed from the one minute averages. If the daily profile is ready, the fifteen minute average is used to update the running average for that particular fifteen minute period for every day the unit has been recording in step S739. Thus, the unit records the average voltage for each of the 96 fifteen minute periods in a 24 hour day, where each fifteen minute average is averaged over all the days in the recording session.

After the daily profile is checked, the unit returns to step S701, to wait for a new second of data.

By using a digital microprocessor 435, the monitoring unit provides a small but sophisticated local processing capability. This processing capability, when linked with the storage capacity of RAM 440, and the programmable instructions and other information in EPROM 436 and EEPROM 437, the monitoring unit provides sophisticated and flexible functionality not present in known monitoring systems of much larger size. The preferred embodiment illustrated in FIGS. 6, 7 and 8 fits in a housing 4.72 inches long, 2.56 inches wide, and 2.56 inches high, weighs only twelve ounces, uses only 1.3 watts of power when recording, and can store from 5 days to 105 days of monitoring data in RAM 440.

For example, the monitoring unit provides that the raw values of the RMS voltage of the AC input waveform may be stored in RAM 440 for later generation of reports on a personal computer. The values stored in the RAM 440 may also be used for local analysis or digital filtering by microprocessor 435. Alternatively or additionally, the values in RAM 440 may be saved for more sophisticated analysis (for example, fast Fourier transform) at the personal computer.

Moreover, the microprocessor 435 may implement intelligent alarm routines which selectively activate a local alarm (such as LED 477) or, via communications interface 455, which interrupt the personal computer or other destination which may be remote from the monitoring unit.

By using a plurality of monitoring units such as in the configurations of FIGS. 2 and 3, a system PC (in FIG. 2) or a monitoring center (in FIG. 3) can monitor a very wide geographical area and a large number of pieces of electrical equipment that are distributed across a large power grid. This monitoring capability makes it easy to determine whether a given network or system fault is due to power abnormalities.

Further, the use of a variety of remotely located monitoring units, each having a microprocessor capable of communicating potentially complex information, allows the system PC or monitoring center to monitor a very large amount of power information in real time. Advantageously, comprehensive reports can be generated from this information.

A further use of the present monitoring unit is in user-initiating questioning. For example, in a university setting, if a remote terminal user is experiencing difficulties with his terminal, he may telephone the individual manning the monitoring center. Over the communications link between the monitoring center and the remote location, the monitoring center operator interrogates the microprocessor 435 in the monitoring unit associated with the remote user. The microprocessor 435 may analyze its recent history of voltage waveform information in RAM 440 and provide the results of its analysis to the monitoring center, or may simply forward this information in raw form back to the monitoring center for display or analysis there. In this manner, the individual running the monitoring center can quickly determine whether the remote user's difficulties are caused by power faults.

In summary, the monitoring unit provides a system in which one or more remote devices plug into a wall outlet where power quality, such as voltage levels, is in question or are otherwise to be monitored. The monitoring units may connect into a local area network or wide area network through a local personal computer, or directly into a LAN or WAN via internal network interface.

Modifications and variations of the above-described embodiments of the present monitoring unit are possible, as appreciated by those skilled in the art in light of the above teachings. For example, while the above-described embodiment of the monitoring unit is a digitally based device employing a software program (a listing of the software program for the disclosed embodiment is included in the Microfiche Appendix, one or more of the functions of the monitoring unit may alternatively be performed by analog circuitry. It is therefore to be understood that, within the scope of the appended claims and their equivalents, the invention may be practiced otherwise than as specifically described.

We claim:

1. A voltage monitoring and recording device, comprising:
   a power portion for receiving voltage from an external power supply and providing a voltage proportional to the received voltage;
   a controller portion for monitoring and recording voltage information for voltage provided by the power portion, the controller portion including averaging means for determining an average root mean square voltage value of voltages provided by the power portion for each of a plurality of preset time intervals occurring during a recording period; and
   a communication portion, for receiving operation instruction from an external communications network, and for communicating recorded voltage information to the external communications network,
   wherein the preset time intervals include a one second interval and a one minute interval, and wherein the averaging means determines
      a one second average root mean square voltage value of voltage provided by the power portion, and
      a one minute average root mean square voltage value of voltage provided by the power portion.

2. A voltage monitoring and recording device, comprising:
   a power portion for receiving voltage from an external power supply and providing a voltage proportional to the received voltage;
   a controller portion for monitoring and recording voltage information for voltage provided by the power portion, the controller portion including averaging means for determining an average root mean square voltage value of voltages provided by the power portion for each of a plurality of preset time intervals occurring during a recording period; and
   a communication portion, for receiving operation instruction from an external communications network, and for communicating recorded voltage information to the external communications network,
   wherein voltage provided by the power portion is an alternating current voltage and one of the preset time intervals is one cycle of the alternating current voltage,
   wherein the averaging means determines a one cycle average root mean square voltage value of voltage provided by the power portion, and
   wherein the controller portion further includes recording means for recording a maximum one cycle average root mean square voltage value for each of one or more of the preset time intervals occurring during the recording period.

3. A voltage monitoring and recording device, comprising:
   a power portion for receiving voltage from an external power supply and providing a voltage proportional to the received voltage;
   a controller portion for monitoring and recording voltage information for voltage provided by the power portion, the controller portion including averaging means for determining an average root mean square voltage value of voltages provided by the power portion for each of a plurality of preset time intervals occurring during a recording period; and
   a communication portion, for receiving operation instruction from an external communications network, and for communicating recorded voltage information to the external communications network,
   wherein voltage provided by the power portion is an alternating current voltage and one of the preset time intervals is one cycle of the alternating current voltage,
   wherein the averaging means determines a one cycle average root mean square voltage value of voltage provided by the power portion, and
   wherein the controller portion further includes recording means for recording a minimum one cycle average root mean square voltage value for each of one or more of the preset time intervals occurring during the recording period.

4. A voltage monitoring and recording device, comprising:
   a power portion for receiving voltage from an external power supply and providing a voltage proportional to the received voltage;
   a controller portion for monitoring and recording voltage information for voltage provided by the power portion, the controller portion including averaging means for determining an average root mean square voltage value of voltages provided by the power portion for each of a plurality of preset time intervals occurring during a recording period; and
   a communication portion, for receiving operation instruction from an external communications network, and for communicating recorded voltage information to the external communications network, wherein
   the recording period is longer than twenty-four hours;
   one of the preset time intervals is a first time interval, wherein the averaging means determines an average root mean square voltage value for each first time interval occurring in each twenty-four hour period of the recording period; and the controller portion further includes a second averaging means for averaging corresponding first time interval average root mean square voltage values for each twenty-four hour period of the recording period.

5. A voltage monitoring and recording device according to claim 4, wherein the first time interval is a fifteen minute interval.

6. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltages provided by the power portion for each of a plurality of preset time intervals occurring during a recording period; and a communication portion, for receiving operation instruction from an external communications network, and for communicating recorded voltage information to the external communications network, wherein one of the preset time intervals is a first time interval, wherein the averaging means determines an average root mean square voltage value for each first time interval occurring during the recording period; and the controller portion further includes rounding means for rounding each first time interval average root mean square voltage value determined by the averaging means to an integral voltage value within a preset voltage value range.

7. A voltage monitoring and recording device according to claim 6, wherein the controller portion further includes recording means for recording, for each integral voltage value within the preset voltage value range, the number of rounded first time interval average root mean square voltage values equal to each integral voltage value occurring during the recording period.

8. A voltage monitoring and recording device according to claim 7, wherein the first time interval is a one minute interval.

9. A voltage monitoring and recording device according to claim 6, wherein the first time interval is a one minute interval.

10. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltages provided by the power portion for each of a plurality of preset time intervals occurring during a recording period; and a communication portion, for receiving operation instruction from an external communications network, and for communicating recorded voltage information to the external communications network, wherein the controller portion further includes a flicker determining means for determining when an average root mean square voltage value varies from a previous average root mean square voltage value by a threshold amount and at a frequency exceeding a preset flicker rate.

11. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltages provided by the power portion for each of a plurality of preset time intervals occurring during a recording period; and a communication portion, for receiving operation instruction from an external communications network, and for communicating recorded voltage information to the external communications network, wherein the controller portion includes first abnormal voltage determining means for determining when an average root mean square voltage value of voltage provided by the power portion exceeds a first preset voltage value range for a preset trigger period, and the controller portion further includes second abnormal voltage determining means for determining when a root mean square voltage value of voltage provided by the power portion exceeds a second preset voltage value range for the preset trigger period.

12. A voltage monitoring and recording device according to claim 11, wherein the second preset voltage value range is variable.

13. A voltage monitoring and recording device according to claim 11, wherein the controller portion records the time and date when the average root mean square voltage value of voltage provided by the power portion exceeds the second preset voltage value range for the preset trigger period.

14. A voltage monitoring and recording device according to claim 11, further including a display portion for indicating when the average root mean square voltage value exceeds the second preset voltage value range for the preset trigger period.

15. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltages provided by the power portion for each of a plurality of preset time intervals occurring during a recording period; and a communication portion, for receiving operation instruction from an external communications network, and for communicating recorded voltage information to the external communications network, wherein the plurality of preset time intervals includes a first time interval and a second time interval greater than the first time interval, and the controller portion further includes recording means for recording a maximum first time interval average root mean square voltage value for each second time interval occurring during the recording period.

16. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltages provided by the power portion for each of a plurality of preset time intervals occurring during a recording period; and a communication portion, for receiving operation instruction from an external communications network, and for communicating recorded voltage information to the external communications network, wherein the plurality of preset time intervals includes a first time interval and a second time interval greater than the first time interval, and the controller portion further includes recording means for recording a minimum first time interval average root mean square voltage value for each second time interval occurring during the recording period.

17. A voltage monitoring and recording device, comprising:

a power portion for receiving voltage from an external power supply and providing a voltage proportional to the received voltage;

a controller portion for monitoring and recording voltage information for voltage provided by the power portion, the controller portion further including averaging means for determining an average root mean square voltage value of voltage provided by the power portion, and significant change determining means for determining when an average root mean square voltage value varies from a previous average RMS voltage value by a threshold amount; and a communication portion, for receiving operation instruction from an external communications network, and for communicating recorded voltage information to the external communications network, wherein the controller portion further includes a flicker determining means for determining when an average root mean square voltage value varies from a previous average root mean square voltage value by a second threshold amount and at a frequency exceeding a preset flicker rate.

18. A voltage monitoring and recording device according to claim 17, wherein the controller portion further includes memory means for storing a time at which the average root mean square voltage value varies from the previous average root mean square voltage value by the threshold amount.

19. A voltage monitoring and recording device, comprising:

a power portion for receiving voltage from an external power supply and providing a voltage proportional to the received voltage;

a controller portion for monitoring and recording voltage information for voltage provided by the power portion, the controller portion including averaging means for determining an average root mean square voltage value of voltage provided by the power portion, and first abnormal voltage determining means for determining when an average root mean square voltage value of voltage provided by the power portion exceeds a first preset voltage value range for a preset trigger period; and a communication portion, for receiving operation instruction from an external communications network, and for communicating recorded voltage information to the external communications network, wherein the controller portion further includes second abnormal voltage determining means for determining when a root mean square voltage value of voltage provided by the power portion exceeds a second preset voltage value range for a second preset trigger period.

20. A voltage monitoring and recording device according to claim 19, wherein the second preset voltage value range is variable.

21. A voltage monitoring and recording device according to claim 19, wherein the controller portion records the time and date when an average root mean square voltage value of voltage provided by the power portion exceeds the second preset voltage value range for the second preset trigger period.

22. A voltage monitoring and recording device according to claim 19, further comprising a display portion, wherein the display portion indicates when an average root mean square voltage value exceeds the second preset voltage value range for the second preset trigger period.

* * * * *